US009111321B2

(12) United States Patent
Bullen et al.

(10) Patent No.: US 9,111,321 B2
(45) Date of Patent: *Aug. 18, 2015

(54) GENERATION OF RENEWABLE ENERGY CERTIFICATES FROM DISTRIBUTED PRODUCERS

(71) Applicant: Solar Components LLC, Campbell, CA (US)

(72) Inventors: M. James Bullen, Los Gatos, CA (US); C. Warren Sattler, Menlo Park, CA (US)

(73) Assignee: Solar Components LLC, Menlo Park, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 14/135,233

(22) Filed: Dec. 19, 2013

(65) Prior Publication Data

US 2014/0176044 A1    Jun. 26, 2014

Related U.S. Application Data

(63) Continuation of application No. 12/706,645, filed on Feb. 16, 2010, now Pat. No. 8,629,646, which is a continuation-in-part of application No. 12/351,105, filed on Jan. 9, 2009, now abandoned.

(51) Int. Cl.
*H01M 10/44* (2006.01)
*H02J 7/00* (2006.01)
(Continued)

(52) U.S. Cl.
CPC ............... *G06Q 50/06* (2013.01); *G06Q 30/02* (2013.01); *H01L 31/02021* (2013.01); *H02J 7/35* (2013.01); *H02J 13/00* (2013.01); *Y02E 10/50* (2013.01)

(58) Field of Classification Search
CPC ........... G06Q 30/02; G06Q 50/06; H02J 7/35; H02J 13/00; H01L 31/02021

USPC .................................... 320/101, 103; 705/412
See application file for complete search history.

(56) References Cited

U.S. PATENT DOCUMENTS

| 5,686,809 A | 11/1997 | Kimura et al. |
| 6,078,871 A | 6/2000 | Anderson |

(Continued)

FOREIGN PATENT DOCUMENTS

| WO | WO 2010/080924 A1 | 7/2010 |
| WO | WO 2011/005874 A1 | 1/2011 |

(Continued)

OTHER PUBLICATIONS

U.S. Appl. No. 61/224,835, filed Jul. 10, 2009.

(Continued)

*Primary Examiner* — M'Baye Diao
(74) *Attorney, Agent, or Firm* — Haynes and Boone, LLP

(57) ABSTRACT

A system and method for recorded renewable energy certificates from power produced by small power generators is provided. An appliance can include a renewable energy source and electronics to monitor and control the charging of batteries in the appliance utilizing power from the renewable energy source. Power from the batteries can be utilized to power or charge external devices. The electronics also records the total power production from the renewable energy source and uploads transaction records to either an external device for transmission to a records server or uploads it directly to the records server itself. The records server compiles the transaction records and generates renewable energy certificates by aggregating the transaction records. Renewable energy certificates can be redeemed in exchange for real or virtual goods and services.

13 Claims, 20 Drawing Sheets

(51) Int. Cl.
   *G06F 17/00*   (2006.01)
   *G06Q 50/06*   (2012.01)
   *H02J 13/00*   (2006.01)
   *G06Q 30/02*   (2012.01)
   *H01L 31/02*   (2006.01)
   *H02J 7/35*    (2006.01)

(56) References Cited

U.S. PATENT DOCUMENTS

| | | | |
|---|---|---|---|
| 6,181,103 | B1 | 1/2001 | Chen |
| 6,363,401 | B2 | 3/2002 | Yahya et al. |
| 6,456,036 | B1 | 9/2002 | Thandiwe |
| 6,538,341 | B1 | 3/2003 | Lang et al. |
| 6,892,165 | B2 | 5/2005 | Yagi et al. |
| 6,950,730 | B1 | 9/2005 | Bouwhuis |
| 6,977,479 | B2 | 12/2005 | Hsu |
| 6,990,395 | B2 | 1/2006 | Ransom et al. |
| 8,629,646 | B2 * | 1/2014 | Bullen et al. ............ 320/101 |
| 2002/0039069 | A1 | 4/2002 | Chance et al. |
| 2003/0041110 | A1 * | 2/2003 | Wenocur et al. ......... 709/206 |
| 2004/0212344 | A1 | 10/2004 | Tamura et al. |
| 2006/0161450 | A1 * | 7/2006 | Carey et al. ............... 705/1 |
| 2006/0241951 | A1 * | 10/2006 | Cynamom et al. ......... 705/1 |
| 2007/0038516 | A1 * | 2/2007 | Apple et al. ............. 705/14 |
| 2008/0036417 | A1 | 2/2008 | Toya et al. |
| 2008/0091590 | A1 | 4/2008 | Kremen |
| 2008/0091626 | A1 * | 4/2008 | Kremen ................... 705/412 |
| 2008/0111517 | A1 | 5/2008 | Pfeifer et al. |
| 2009/0048700 | A1 | 2/2009 | Mock et al. |
| 2009/0066287 | A1 | 3/2009 | Pollack et al. |
| 2009/0177580 | A1 | 7/2009 | Lowenthal et al. |
| 2009/0234757 | A1 | 9/2009 | Tarbell et al. |
| 2010/0052425 | A1 | 3/2010 | Moore et al. |
| 2010/0176760 | A1 | 7/2010 | Bullen |
| 2010/0211812 | A1 | 8/2010 | Bullen et al. |
| 2010/0235008 | A1 * | 9/2010 | Forbes et al. ............ 700/291 |
| 2011/0005576 | A1 | 1/2011 | Bullen et al. |
| 2011/0006727 | A1 | 1/2011 | Blau et al. |

FOREIGN PATENT DOCUMENTS

| | | | |
|---|---|---|---|
| WO | WO 2011/006129 | A1 | 1/2011 |
| WO | WO 2011/103121 | A1 | 8/2011 |

OTHER PUBLICATIONS

Office Action dated Apr. 15, 2011 in parent application, U.S. Appl. No. 12/351,105.
Final Office Action dated Jan. 31, 2012 in parent application, U.S. Appl. No. 12/351,105.
Office Action dated Mar. 12, 2013 in parent application, U.S. Appl. No. 12/351,105.
Restriction Office Action dated Jun. 11, 2012 in parent application, U.S. Appl. No. 12/706,645.
Office Action dated Jul. 9, 2012 in parent application, U.S. Appl. No. 12/706,645.
Final Office Action dated Feb. 12, 2013 in parent application, U.S. Appl. No. 12/706,645.
Notice of Allowance dated Sep. 12, 2013 in parent application, U.S. Appl. No. 12/706,645.
PCT International Search Report and the Written Opinion mailed Mar. 15, 2010, in related International Application No. PCT/US2010/020388.
PCT International Preliminary Report on Patentability and the Written Opinion mailed Jul. 21, 2011, in related International Application No. PCT/US2010/020388.
PCT International Search Report and the Written Opinion mailed Apr. 15, 2011, in related International Application No. PCT/US2011/024982.
PCT International Preliminary Report on Patentability and Written Opinion mailed Aug. 30, 2012, in related International Application No. PCT/US2011/024982.
Facebook App Tracks Energy Consumption. Environmental and Energy Management News (online) Jul. 25, 2008, (retrieved Mar. 29, 2011). Retrieved from the Internet: <URL: http://www.enfironmentalleader.com/2008/07/25/facebook-app-tracks-energy-consumption/>.

* cited by examiner

| | MSB | | | LSB |
|---|---|---|---|---|
| 1 | Unused | | | |
| 2 | | | ACK | |
| 3 | Day | Unused | | |
| 4 | Unused | Month | Hour | Year |
| 5 | IP Address 1 | | | Minute |
| 6 | IP Address 3 | | IP Address 2 | |
| 7 | Unused | | IP Address 4 | |
| 8 | Unused | | | |
| 9 | Unused | | | |
| 10 | Unused | | | |
| 11 | Unused | | | |
| 12 | Unused | | | |
| 13 | Unused | | | |
| 14 | Unused | | | |
| 15 | Unused | | | |
| 16 | Checksum | | | |

| MSB | | | | | | | LSB |
|---|---|---|---|---|---|---|---|
| pSA Model | | | | BEL | | | |
| Day | | Month | | | Year | | |
| Unused | | | Hour | | Minute | | |
| LON | LAT | Latitude Minutes | | | | | |
| Longitude Low Order Degree | | | | | Latitude Degrees | | |
| LON HO Degrees | | Longitude Minutes | | | | | |
| Unused | | Latitude Seconds | | | Longitude Seconds | | |
| Serial Number 1 | | | | Serial Number 2 | | | |
| Serial Number 3 | | | | Serial Number 4 | | | |
| Serial Number 5 | | | | Serial Number 6 | | | |
| Serial Number 7 | | | | Serial Number 8 | | | |
| Serial Number 9 | | | | Serial Number 10 | | | |
| Serial Number 11 | | | | Unused | | | |
| Unused | | | | | | | |
| Energy Produced | | | | | | | |
| Checksum | | | | | | | |

GENERATION OF RENEWABLE ENERGY CERTIFICATES FROM DISTRIBUTED PRODUCERS

RELATED APPLICATIONS

The present application is a continuation of Ser. No. 12/706,645, filed Feb. 16, 2010, which is a continuation-in-part of U.S. application Ser. No. 12/351,105, filed on Jan. 9, 2009, which both are herein incorporated by references in their entirety.

BACKGROUND

1. Field

Embodiments of the invention relate generally to management of solar energy systems and, in particular, to the generation of solar renewable energy certificates.

2. Discussion of related art.

Renewable Energy Certificates (RECs), which includes Solar Renewable Energy Credits (SRECs), are a form of Renewable Energy Certificate or Green tag utilized to reward the producers of renewable energy. RECs are available in states where a Renewable Portfolio Standard (RPS) exists with a specific allocation for solar energy. SREC programs, for example, provide a means for SRECs to be created on behalf of a solar panel owner and sold to state electric suppliers to meet the solar RPS requirement. Electric suppliers are then required to use the SREC program to show compliance with this part of the State's Renewable Portfolio Standard.

The SREC is separate from the value of the electricity itself and permits the owner or purchaser to claim the benefits of the clean energy production by effectively subsidizing the cost of the installed system. SRECs are designed to provide individuals and corporations with an economic incentive to investing in solar electric systems, which improve the electrical distribution grid. SRECs represent the renewable attributes from a solar facility and are typically bundled in minimum denominations of one megawatt hour of production. The additional income received from selling solar certificates increases the economic value of an investment in renewable energies. Instead of up-front subsidies from the state, solar system owners can recover their investment in the solar system by selling certificates to utilities.

In order to produce SRECs, a solar system must first be certified by state regulatory agencies, usually public service commissions or public utility commissions, and then registered with a trading platform. Once a solar system is certified with the state agency and registered with a trading platform, SRECs can be issued using either an estimate table or actual meter readings by the trading platform - depending upon state regulations. In some cases, smaller installations may be able to use estimates, while actual meter readings are required for large installations. One SREC is created for every megawatt hour of electricity produced from a qualified solar renewable energy generator.

In Pennsylvania, New Jersey, Delaware, Ohio, Maryland and the District of Columbia solar systems are registered with, and SRECs are issued by, PJM Environmental Information Services Generation Attribute Tracking System PJM-EIS GATS. The Western Renewable Energy Generation Information System (WREGIS) is an independent, renewable energy tracking system for the region covered by the Western Electricity Coordinating Council (WECC). WREGIS tracks renewable energy generation from units that register in the system using verifiable data and creates renewable energy certificates (RECs) for this generation. WREGIS Certificates can be used to verify compliance with state and provincial regulatory requirements and in voluntary market programs. PJM-EIS GATS and WREGIS are accreditation entities and ultimately they, or similar organizations, issue RECs.

Therefore, there is a need for solar components that better track power production in order to allow the generation of RECs.

SUMMARY

Consistent with some embodiments of the present invention, a system and method for the capture and aggregation of renewable energy certificates based on power produced by a renewable power appliance is presented. An apparatus according to some embodiments of the present invention can include a renewable power source; an electronic circuit coupled to the renewable power source that provides charging for a battery and distributes power to a connector when an external device is coupled to the connector; a control system coupled to the electronic circuit that controls the charging of the battery and the distribution of power to the external device, wherein the control system compiles a transmission record of the amount of power produced by the apparatus. In some embodiments, the renewable power source is a solar cell. In some embodiments, the transmission record can be sent to an external device, for example a smart phone, coupled to a connector. In some embodiments, the transmission record can be directly communicated with a records server for recordation of the power produced in the apparatus.

A smart phone according to some embodiments of the present invention can include a connector that couples to an appliance, the appliance including a renewable power source, a battery, electronics that distribute power between the renewable power source, the battery, and the connector, and a processor that monitors and compiles an amount of power generated by the appliance; and a processor that executes a software code that monitors the appliance, receives a transmission record of the amount of power generated by the appliance, and transmits the amount of power generated to a REC server.

A server according to some embodiments of the present invention can include a database; a network connection; and a processor coupled to receive transmission records from a sender, the processor recording individual transmission in the database, and compiling the individual transmission records into a single renewable energy certificate once record of sufficient power generation to generate a renewable energy certificate is received. In some embodiments, the database includes files including individual transmission RECs that are aggregated to form a REC.

A method of recording power generation according to some embodiments of the present invention includes receiving individual transmission records from one or more power generators; recording each of the transmission records into a database; monitoring the transmission records in the database until record of sufficient power generation to receive a renewable energy certificate is received; closing the database to indicate one renewable energy certificate; and opening a new database for receipt of further individual transmission records once a database is closed.

Records can be sorted, for example by geographic location or by ownership. Records and certificates may be traded in the real or virtual world for real or virtual goods and services.

These and other embodiments of the invention are further described below with respect to the following figures.

BRIEF DESCRIPTION OF THE FIGURES

FIGS. 9A through 9F illustrate various data packets that may be exchanged between a sender and a REC server according to some embodiments of the present invention.

Figure 1A:
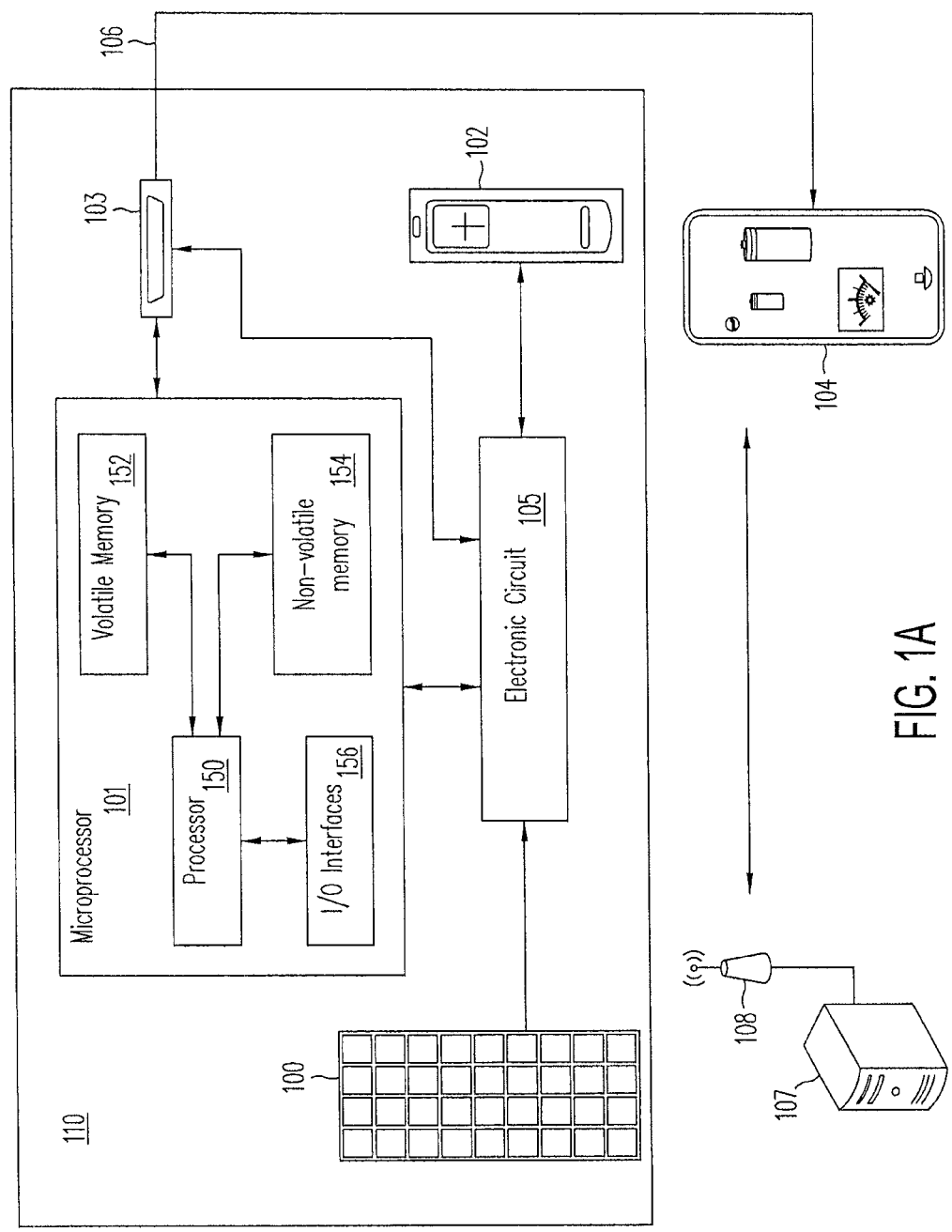
FIG. 1A illustrates a personal solar appliance (pSA) that is coupled to a smart phone running an energy dashboard application according to some embodiments of the present invention.

In the figures, where possible, components that have the same or similar functionality have the same designation.

DETAILED DESCRIPTION

U.S. application Ser. No. 12/351,105, which is herein incorporated by reference in its entirety, describes an intelligent protective case with photovoltaic, battery, and electronics for use by an intelligent user device. The application also describes the architecture whereby software is obtained and installed for use on the intelligent user device, including utilization of networks such as the Internet for production. The intelligent user device can be a smart phone (iPhone, Blackberry, Nexus, etc.), however other devices with wireless networking capabilities such as laptop or other computers may also be included.

A personal solar appliance (pSA) is described in U.S. Provisional Application Ser. No. 61/224,835, filed on Jul. 10, 2009, and herein incorporated by reference in its entirety. The personal solar appliance (pSA) is a device that stores solar energy in its battery for subsequent powering or recharging of any number of consumer electronic devices (cell phones, lights, fans, water purification systems, radios, computers, MP3 players, and so forth). When the pSA's battery is full it will stop storing energy until it discharges some of its battery.

In accordance with some embodiments of the present invention, the pSA can keep track of the energy generated, along with other information, in a data record and can provide this data record to a web browser based graphical user interface. Some embodiments of the pSA can also provide this information to a smart phone when otherwise charging the smart phone, or can itself communicate the information to a network.

A smart phone is a mobile phone offering advanced capabilities, often with PC-like functionality (PC-mobile handset convergence). There is no industry standard definition of a smart phone. For some, a smart phone is a phone that runs complete operating system software providing a standardized interface and platform for application developers. For others, a smart phone is simply a phone with advanced features like e-mail, Internet, e-book reader capabilities, and/or a built-in full keyboard or external USB keyboard and VGA connector. In other words, it is a miniature computer that has phone capability. Some examples of smart phones include Research In Motion's Blackberry, Apple Computer's iPhone, or Google's Nexus One. These smart phones support advanced software development environments for the creation of custom software. In this disclosure, a smart phone is any device that can couple to a pSA, execute an applet, and transmit data to a network.

Software operating on a smart phone that interfaces with a pSA and a central server is referred to as an applet. In principal the applet may be created for any type of smart phone supporting custom software development efforts. For illustrative purposes, embodiments of applets that operate with the iPhone are specifically described. It will be understood that applets for other smart phones can operate similarly.

The applet may include a unique button on the iPhone's main menu that will launch the applet. When launched, and if the smart phone is connected to a pSA, the applet can collect a pSA transaction ($pSA_t$). This $pSA_t$ includes the amount of renewable energy produced by the pSA in watt hours along with other renewable energy information that will be communicated to the applet. Once communicated to the applet, the pSA may zero out its renewable energy counter and starts again.

The applet may already have a pending amount of $pSA_t$ information waiting to be uploaded to a central server. If this is the case the new amount of $pSA_t$ can be added to the pending amount. The total amount can then be uploaded to a central server at that time, when the user sends the information, or when the phone obtains proper coverage.

When the applet is running it can build a renewable energy certificate transaction ($REC_t$). The $REC_t$ can include a date and time stamp, the smart phone identity, the amount of renewable energy to be uploaded, the GPS of the smart phone, and the identity of the $REC_t$ owner. The applet can then communicate with a renewable energy certificate (REC) server. The applet can communicate with the REC server using mobile networking technology. However, other networking methods may be used.

The applet can communicate with the REC server in a reliable and secure manner One method in which this may be accomplished is to store a checksum in the $REC_t$ and to use a two phase commit protocol for network delivery. The checksum is used to ensure the data integrity of the $REC_t$ itself. The two phase commit will ensure the applet information is actually transmitted to the REC server. Another method is to send all of the information in a single packet to the REC server. Various integrity checking procedures may be implemented to insure the accurate transmission of the data in the packet.

The applet may zero out its pending $REC_t$ data and increase a $REC_t$ uploaded history counter once confirmation of a successful transmission is received. If during the two phase commit waits or negative acknowledgements are transmitted by the REC server the applet complies by waiting or retransmitting as necessary. If this continues then at some point the applet may abandon the effort and will attempt again after a wait period. With these methods the $pSA_t$ is collected and the subsequent $REC_t$ is reliably sent to the REC server.

The REC server can have a network interface that permits it to communicate with many applets simultaneously. It also can include a database structure that archives $REC_ts$ and aggragates them into renewable energy certificates (REC). In most cases, each REC is defined as a megawatt hour. Therefore, each REC is composed of more than one $REC_t$. In some embodiments, for example, each $REC_t$ is 32 bytes in size. If, for example, the average $REC_t$ reports 10 watt hours of renewable energy, then each REC may include approximately 3.2 megabytes of $REC_t$ data. This relationship and its contents (REC to $REC_t$) can be kept for analysis by accreditation entities to ensure there is accurate accounting for each REC or SREC. Once the accreditation entity is satisfied the REC or SREC can be issued.

The $REC_t$ can further include global positioning system data that permits the $REC_ts$ to be sorted into more than one file depending upon the geographic location where the $REC_t$ originated. Business rules may be created that sort the $REC_ts$ from different geographic locations, for examples $REC_ts$ that originate in New Jersey can be sorted with others that originate in New Jersey, or the $REC_ts$ can be sorted into United States, Germany, European Union, or Australia SRECs. Business rules may also be created to sort the $REC_ts$ by owner or user ID. The database for the storage of $REC_ts$ can be a sequential file of first in, first stored that is grown until a complete REC is created. When the REC is full (i.e., when the total of the energy recorded in the RECts matches or exceeds the amount that forms a REC) the REC is accounted for and a new REC can be started. This process can be continuously repeated. If, for example, 100 RECs per day are generated, the storage requirements for an entire year would be on the order of 116 gigabytes. This amount of storage is easily managed with today's storage technology and the resulting RECs represent 36.5 gigawatt hours of renewable energy.

The utilization of renewable energy devices such as the pSA may be thought of as beneficial as the world begins to shift from carbon based energy technologies to renewable forms of energy. Those that produce renewable energy should be rewarded for that behavior.

In order for renewable energy transactions to be utilized in a reward system the originator of the transaction should be known. In some embodiments, each pSA includes a unique serial number that is accessible by software and can be transmitted to an applet or other GUI application. In an 11 digit serial number, for example, there are $2^{32}$ or over 4 billion unique serial number possibilities. Combining the serial number with multiple pSA types provides an even larger pool of identification numbers. In some embodiments, an originator can associate the identity of a particular pSA as belonging to that originator. The originator association may be made with a name, e-mail address, or similar association. Once the pSA is associated with an originator, the renewable energy certificate generated can be utilized in a variety of ways.

In the real world such records may take the form of currency (REC's for example) or they could be lottery tickets (one ticket, for example, costing a 10 Wh REC), redeemed for merchandise, and so forth. Renewable energy transactions may also be utilized in the virtual world. The transactions may be used in on-line applications to provide virtual energy (for cars, weapons, homes, etc.), virtual currency, to enhance status, and so forth. Social networking sites have significant numbers of on-line applications developed for them. The number of users of these on-line applications is in the 10's of millions. In exchange for incorporating the use of pSA generated renewable energy transactions into the on-line application, an on-line application provider may receive a commission from any pSA sale generated by the on-line application provider and or the social networking provider. In such a fashion, the application user, the application provider and the pSA manufacturer all benefit from the production of RECs. It is important to keep in mind that the application user will not see any benefit from the ownership of the pSA itself in this fashion; rather the benefit will come from using the pSA's generated power. On a regular basis the REC server may send its list of originators and renewable energy transaction amounts for use in on-line applications. Once the application user uses the pSA's energy and places the pSA back in the sun, a cycle of reward for beneficial behavior is created.

Described below, therefore, is a system and ownership architecture for the tracking and generation of RECs from distributed personal solar appliances, small solar systems, or other eligible producers of power from renewable sources. Small solar systems may be anywhere in the world and their energy production transcends national boundaries. The solar devices themselves each may produce a small amount of energy, but the aggregation of these amounts to produce RECs may have significant value to the owner of the RECs. In general, embodiments of the invention can be utilized with any energy producing technology or mixture of technologies and is not limited to solar production alone.

FIG. 1A illustrates a system that includes a pSA 110 coupled to a smart phone 104. Smart phone 104 is charged from pSA 110 and also can be utilized to communicate with server 107. As shown in FIG. 1, pSA 110 includes a solar cell 100 that is coupled to electronic circuit 105. Although the renewable power source in pSA 110 is shown as solar cell 100, in general solar cell 100 can be replaced with any renewable energy source to form a personal appliance 110. The examples provided below utilize a solar appliance as an example, but any power appliance utilizing any renewable energy source that is eligible to produce RECs can be utilized. Therefore, throughout this disclosure, pSA 110 may be interpreted to include any small power producing appliance utilizing a renewable energy source.

Electronic circuit 105 receives power from solar panel 100 and charges battery 102. Electronics 101 controls electronic circuit 105 as it distributes power throughout pSA 110. Electronics 101 may perform maximum power point adjustments and controls electronic circuit 105 as it charges battery 102. Further, electronics 101 is coupled to physical connector 103, which uses a cable 106 to physically attach to smart phone 104. For exemplary purposes, smart phone 104 is illustrated as an iPhone running an energy dashboard application. Smart phone 104 includes a wireless network interface that communicates with wireless network interface 108 of REC server 107. REC server 107 may also be coupled to a network such as the Internet in a variety of methods in addition to, or instead of, including wireless link 108.

As shown in FIG. 1, electronics 101 can be a microprocessor that includes processor 150, volatile memory 152, and non-volatile memory 154. Processor 150 can execute software stored in non-volatile memory 154, utilizing volatile memory 152 for parameter storage and other purposes. As mentioned above, processor 150 can perform maximum power point adjustment calculations in order to control electronic circuit 105 in charging battery 102 and can direct electronic circuit 105 to provide power from battery 102 to connector 103 to charge smart phone 104. Processor 101 can also communicate through I/O interfaces 156 and connector 103 with smart phone 104 and an energy dashboard application operating on smart phone 104.

In some embodiments, electronics 101 can be any suitable microprocessor. In some embodiments, electronics 101 can be a Microchip PIC18 embedded controller. Connector 103 can be any connector, for example a USB connector. Connector 103 is utilized to communicate with and supply power to an external device such as smart phone 104. Solar panel 100 can be any suitable solar panel for producing power. Electronics circuit 105 directs power from solar panel 100 into battery 102 and from battery 102 to connector 103 under the direction of electronics 101. An embodiment of electronic circuit 105 is described in U.S. Provisional Application Ser. No. 61/224,835. Battery 102 can be any storage device of any size. In some embodiments, battery 102 can store up to 80 Wh of electrical energy. In some embodiments, electronics 101 can be coupled to a global positioning system (GPS) to determine the geographical position of pSA 110.

Figure 1B:
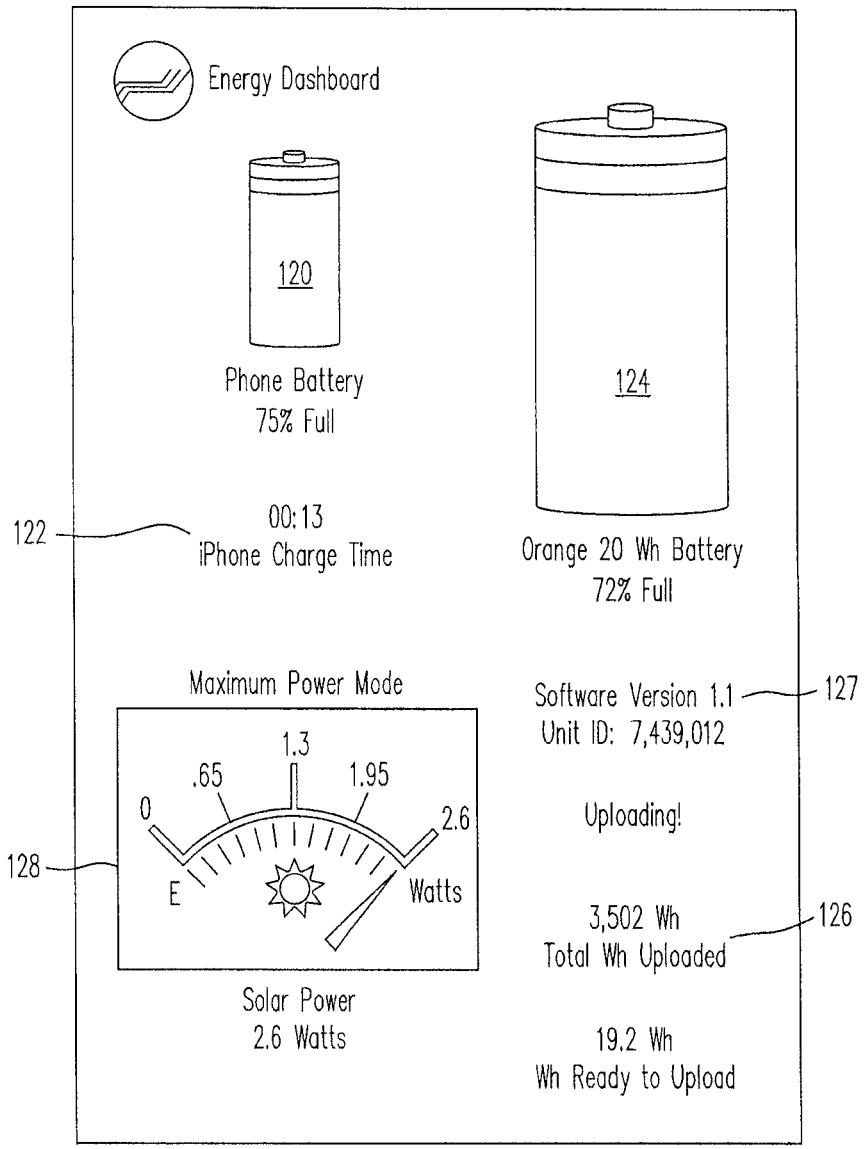
FIG. 1B illustrates a smart phone operating an embodiment of the energy dashboard application.

FIG. 1B illustrates smart phone 104 executing some embodiments of energy dashboard application 120. As shown in FIG. 1B, application 120 displays the battery charge state 122 of smart phone 120 as well as the charge state 124 of pSA 110. Further, application 120 shows the current power production 128 of solar panel 100. Additionally, an indication 126 that the phone is uploading power statistics 126 to server 107 is provided. Additionally, an indication 127 of the unique identity and software version of the pSA 110 is provided. In some embodiments, smart phone 104 uploads a geographic position derived from a GPS system incorporated in smart phone 104. In some embodiments, electronics 101 may be coupled to a GPS and the position communicated through connector 103 to smart phone 104.

Electronics 101, then, can monitor and accumulate power produced by pSA 110 and communicate the power produced to smart phone 104. Smart phone 104, operating application 120, can transmit the power produced by pSA 110, along with other information such as, for example, the local position of smart phone 104 as measured by its internal GPS chip.

Figure 8:
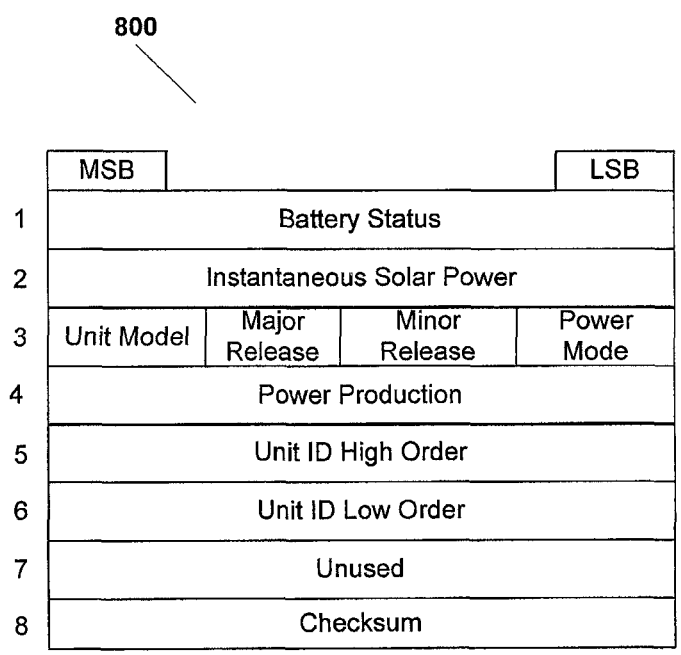
FIG. 8 illustrates a data packet that can be utilized in communication between a pSA and a smart phone according to some embodiments of the present invention.

In some embodiments of the invention, connector 103 can be a USB port that provides standard USB voltages (5 volts at 500 mA) to smart phone 104. pSA 110 then communicates variables to smart phone 104 in a USB packet. FIG. 8 illustrates an example packet 800 that can be utilized. In some embodiments, the packet is 8 words of 16 bits each. As shown in FIG. 8, the pSA battery charge state is transmitted in the first word. The instantaneous solar power production is provided in word 2. The pSA model number and the software operating on the pSA, in major and minor release numbers, are transmitted in word 3 along with the power mode. There may be several different models of pSA 110, and several versions of the software that operate on pSA 110. The power mode indicates the power available in pSA. For example, the power mode may be off, low power, or maximum power. The amount of power produced in pSA 110 since the last upload is provided in word 4. A unit ID, which can be associated with an owner of a REC generated based on the power produced, can be provided in words 5 and 6. A checksum, which is the sum of all of the previous words, is sent in word 8.

Figure 2:
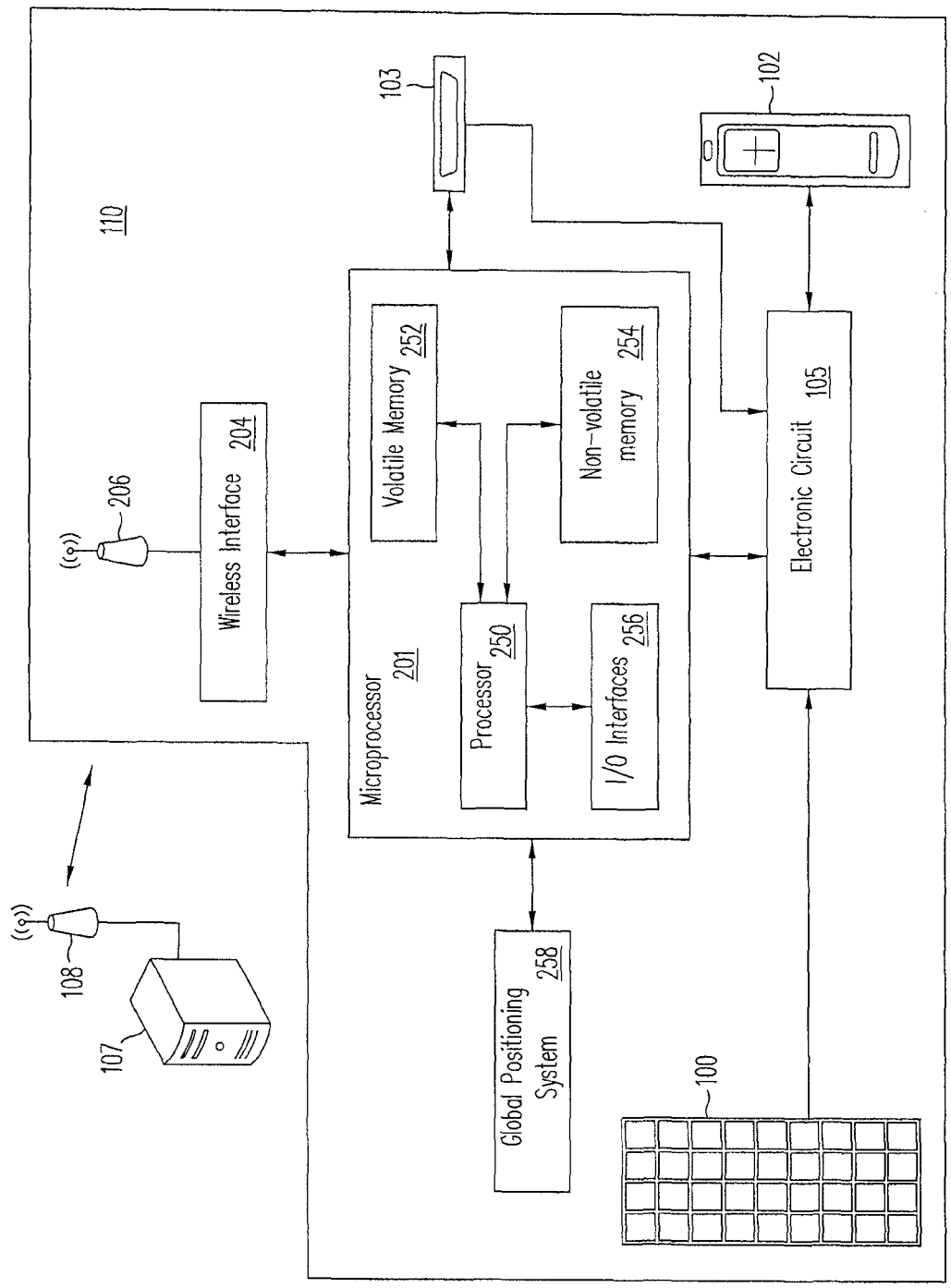
FIG. 2 illustrates a pSA system according to some embodiments of the present invention.

FIG. 2 illustrates an embodiment of pSA 110 that can directly communicate with REC server 107, and therefore can upload transitions $REC_t$s to REC server 107 directly instead of utilizing smart phone 104 as illustrated in FIG. 1A. As such, many of the functions discussed below that are performed on smart phone 104 are instead performed by electronics 201. As shown in FIG. 2, pSA 110 can include solar cell 100 that is coupled to electronic circuit 105, which charges battery 102 and provides power to connecter 103 to charge an external device such as smart phone 104. Circuit 201 is also coupled to electronic circuit 105 and can perform maximum power point adjustments to control the charging of battery 102. Electronics 201 is coupled to physical connector 103 that can be used for charging or supplying power to other consumer electronics devices. Additionally, electronics 201 can be coupled to a wireless interface 204 and coupled to a network through wireless antenna 206. The wireless network can then communicated to REC server 107 through receiver antennal 108. In some embodiments, pSA 110 can be coupled directly to a network system, for example through a networking cable.

As shown in FIG. 2, electronics 201 can be a microprocessor that includes a processor 250, volatile memory 252, and non-volatile memory 254. Microprocessor 250 can then execute software that is stored in non-volatile memory 254. Further, processor 250 can communicate with wireless interface 204 and connector 103 through I/O interface 256. Additionally, electronics 201 may communicate with a global positioning system 258. Therefore, electronics 201 may provide $REC_t$ communications, which includes the amount of power produced by pSA 110 along with its geographic position, to REC server 107. Electronics 201 may be the same microprocessor as processor 101 shown in FIG. 1A, with appropriate modification made to firmware stored in memory 254.

Figure 3A:
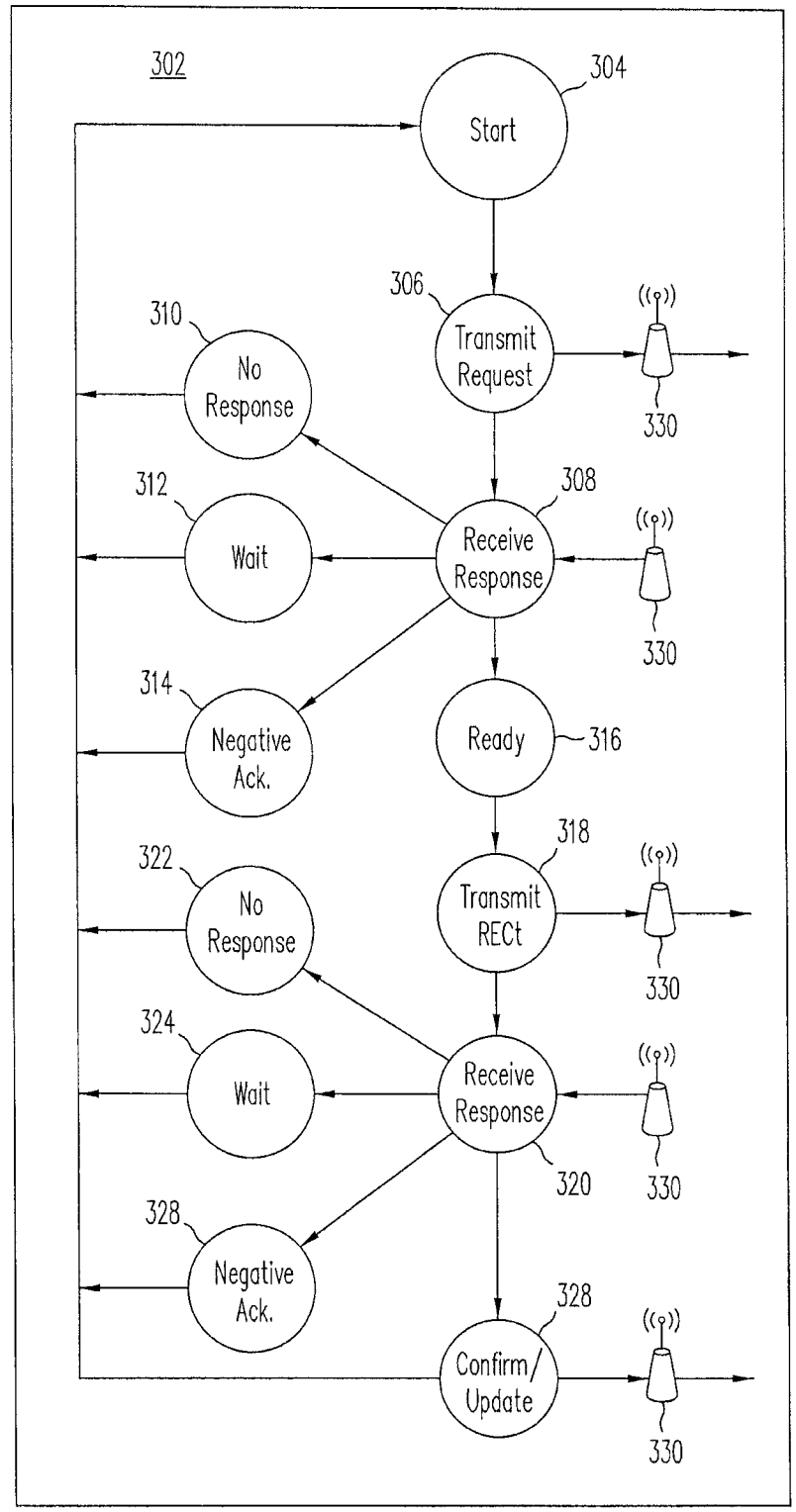
FIGS. 3A and 3B illustrate a two phase commit protocol operating between a sender applet and a centralized REC server according to some embodiments of the present invention.
Figure 3B:
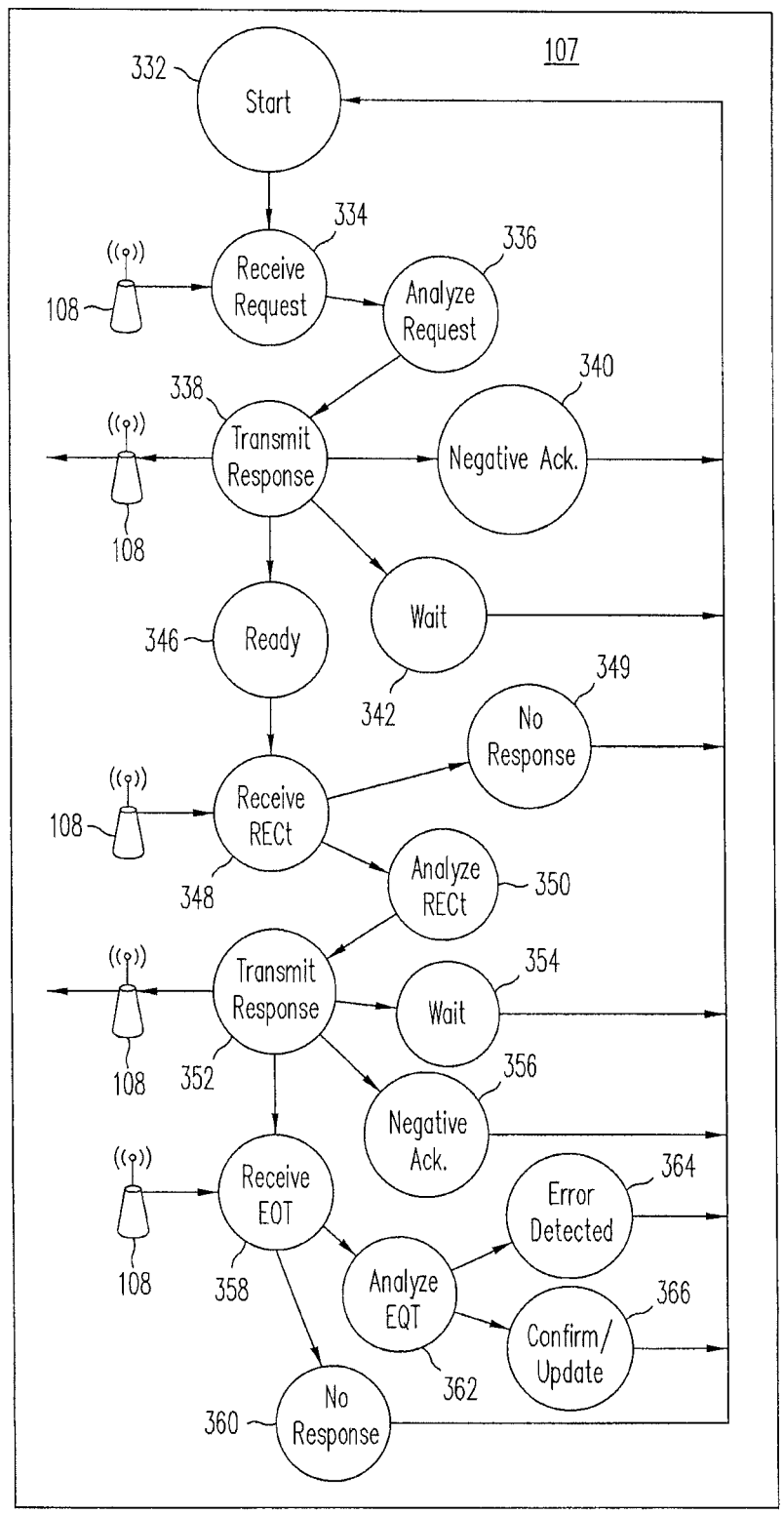

Personal solar appliance 101 with a global positioning system 258 and wireless interface 204 and wireless network 206 communicating with REC server 107 as shown in FIG. 2, or with smart phone 104 communicating with REC server 107 using as shown in FIG. 1 can use a two phase commit protocol. FIG. 3 illustrates a two-phase commit protocol according to some embodiments of the present invention.

FIG. 3 illustrates a two-phase commit protocol interaction 300 between a sender 302 and REC server 107 according to some embodiments of the present invention. Sender 302 may be smart phone 104 as shown in FIG. 1, pSA 110 as shown in FIG. 2, or another transmitter system coupled to pSA 110. Further, communications may be accomplished wirelessly as shown in FIGS. 1 and 2 or may be carried out over another network such as the internet.

As shown in FIG. 3, sender 302 begins in start state 304. Sender 302 remains in start state 304 with regard to this application until pSA 110 has generated a sufficient amount of power to justify sending a $REC_t$ message to REC server 107. This amount may be set by an external user or set as a parameter during production of pSA 110. During start state 304, sender 302 may be performing any other task, for example compiling and monitoring power production in pSA 107. As shown in FIG. 1, if sender 302 is smart phone 104, smart phone 104 may be performing user initiated tasks or monitoring tasks with regard to pSA 110. As shown in FIG. 2, if sender 302 is pSA 110, pSA 110 may be performing other monitoring and communications tasks associated with charging battery 102 or charging an external device.

Similarly, REC server 107 remains in start state 332 until it receives a message from sender 302. In state 332, REC server 107 may be performing other tasks such as, for example, aggregating various previously received $REC_t$s or reporting to a user information such as status.

Figure 9A:
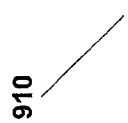

Once sender 302 has justified sending a $REC_t$ to REC server 107, and a valid $REC_t$ has been constructed, then sender 302 transitions to state 306 where a transmit request is sent through network 330, which may be a wireless network 206 as shown in FIG. 2 or a smart phone 104 as shown in FIG. 1A, for example. Once sender 302 has sent the request in state 306, sender 302 proceeds to receive response state 308. The send request may be an enquire (ENQ) packet as illustrated in FIG. 9A.

Upon receipt of a transmission, REC server 107 proceeds to step 334 to receive the request from network 108. In some embodiments, REC server 107 then proceeds to step 336 where the request is analyzed. REC server 107 has four possible responses to the request: no response, a wait request, a negative acknowledgement, and a confirmation of readiness. A wait request can be provided with a SYN packet such as that illustrated in FIG. 9D from REC server 107. A negative acknowledgement can be provided by a NAK packet such as that illustrated in FIG. 9C. A confirmation of readiness can be provided by an ACK packet such as that illustrated in FIG. 9B. The SYN packet, NAK packet, or ACK packet are transmitted from REC server 107 to sender 302.

No response occurs when REC server 107 does not recognize that a request transmission has been received or decides to ignore the request. A wait request results when REC server 107 is currently executing another application and can not currently process the request. A negative acknowledgement results when the request was received, but is somehow flawed. For example, a checksum error may have occurred or the request includes a content error. Finally, a confirmation of readiness can indicate that REC server is ready to receive the $REC_t$.

Once REC server 107 has analyzed the request in state 336, REC server 107 can proceed to transmit response state 338 where, except for the no-response, REC server 107 transmits a response through network 108 where it is received in network 330. Once transmitted, REC server 107 transitions to negative acknowledgment state 340, wait state 342, or ready state 346 based on the transmitted response. In negative acknowledgment 304, an error is logged and REC server 107 transitions back to start state 332. From wait state 342, REC server 107 again transitions back to start 332 to finish other tasks. In ready state 346, REC server 107 transitions to receive $REC_t$ 348 to receive the $REC_t$.

Once a response, or a time-out, has occurred in receive response 308, sender 302 transitions to no response 310, wait 312, negative acknowledgment 314, or ready state 316. In no response state 310, a response delay is initiated for sender 302 before transition back to start state 304, which will again transition to transmit request 306. Wait state 312 initiates a waiting period, which may be received with the wait request in receive response 308, before transition back to start state 304. Negative acknowledgement state 314 elicits a process reason code situation with either a checksum error or a content error. The checksum error indicates an error situation occurred during transmission. The content error indicates that invalid information has been transmitted and the attempt to transmit the $REC_t$ is abandoned. In either case, once the error situation is reported to a user, sender 302 transitions from negative acknowledgment 314 back to start 304.

Confirmation of readiness to receive is the expected response and results in sender 302 transitioning to ready 316 and then to transmit $REC_t$ 318. In transmit $REC_t$, sender 302 transmits the $REC_t$ through network 330 to REC server 107. As indicated above, the $REC_t$ includes data regarding the amount of renewable energy generated by pSA 110 and may further include a date and time stamp, and an identification of sender 302. $REC_t$ may also include location, for example GPS, data for the location of sender 302 and pSA 110.

REC server 107 receives the $REC_t$ into receive $REC_t$ state 348. If a RECt is not received within a specified time, REC server 107 transitions to No-response state 349 where the error is logged. From no-response state 349, REC server transitions to start 332.

Once received, REC server 107 transitions to analyze $REC_t$ state 360. There are three possible responses to the received $REC_t$ message: a wait request, a negative acknowledgement, and a confirmation of receipt of the $REC_t$. From state 350, REC server transitions to transmit state 352 to transmit the response through network 108 to sender 302. If a wait request is sent, REC server transitions through wait state 354 back to start 334. If a negative acknowledgment is sent, which indicates a content error or a checksum error in the received $REC_t$, then a log of the error is made in negative acknowledgment state 356 and REC server 107 transitions back to start 332. If a confirmation of receipt is sent, then REC server 107 transitions to receive EOT state 358 to await received of an End-of-Transition (EOT) packet from sender 302.

The response is received in Receive-response state 320 from network 330. If a wait response is received, then sender transitions to wait state 324 and sender 302 transitions back to start 304 to again attempt a retransmission. If a negative acknowledgment is received, the sender 302 transitions to negative acknowledgment 328 to process reason code situation with either a checksum error or a content error. The checksum error indicates that an error situation occurred during transmission and retransmission should occur. The content error indicates that invalid information was transmitted and the attempt to transmit the $REC_t$ may be abandoned, resulting in either a reconstruction of the $REC_t$ or abandonment and resetting of the current $REC_t$. Once the response has been handled, sender 302 then transitions back to start 304.

If the confirmation of receipt of the $REC_t$ is received (the expected result), then sender 302 transitions to update state 328 where the transaction history is updated and the $REC_t$ is deleted. After the transaction history is updated and the $REC_t$ is deleted, sender 302 then transmits an EOT packet through network 330 and returns to start state 304 until another $REC_t$ is formed. If during the communications protocol too many wait responses are received or too many retransmissions occurs, sender 302 may record an excessive wait condition and either abandon the current $REC_t$ or wait a further time before attempting to resend.

In receive EOT state 358, if no transmission is received in a set period of time, REC server 107 transitions to state 460 where the transaction is abandoned. From state 360, after the statistics have been updated, REC server 107 transitions back to start 332.

If an EOT packet is received, then REC server 107 transitions to step 362 where the packet is analyzed. If there are no errors detected in the packet, then REC server 107 transitions to update step 366 where the received $REC_t$ is loaded into the database. REC server 107 then transitions back to start 332. If an error has occurred, however, then REC server transitions to step 364 where the transaction is abandoned and then transitions back to start 332.

Figure 4A:
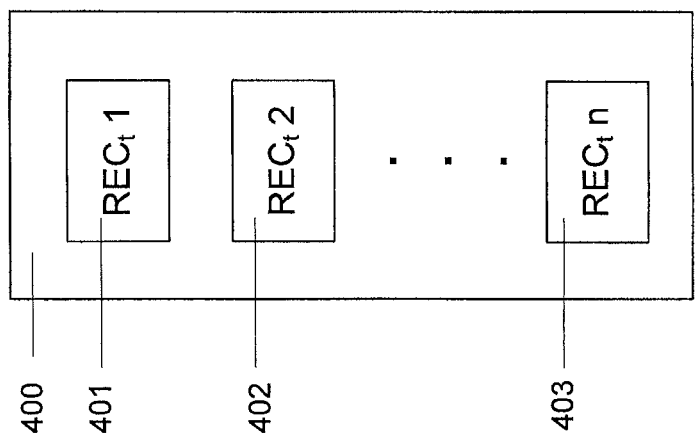
FIG. 4A illustrates a REC that is composed of "n" $REC_t$s according to some embodiments of the present invention.

As shown in FIG. 4A, in update state 358 in some embodiments REC server 107 places the $REC_t$ 401 in a sequential database file structure 400. As REC server 107 continues to place further $REC_t$ 402 while totaling the renewable energy contained in sequential database file structure 400. When $REC_t$ 403 causes the total of renewable energy to be equal to or greater than the value for one renewable energy certification (for example 1 megawatt hour) sequential database 400 is closed and administratively marked as a renewable energy certificate that may be sold or traded. $REC_t$s 401, 402, through 403 are always available for inspection by accreditation authorities to ensure accounting trustworthiness. In some embodiments, REC server 107 may have several file structures 400 active, each structure 400 corresponding to a different geographic location or to a different user. As new $REC_t$s are received, REC server 107 sorts them and places them in a structure 400 that corresponds to the identified geographic location, identified user, or some other sorting rule.

Figure 4B:
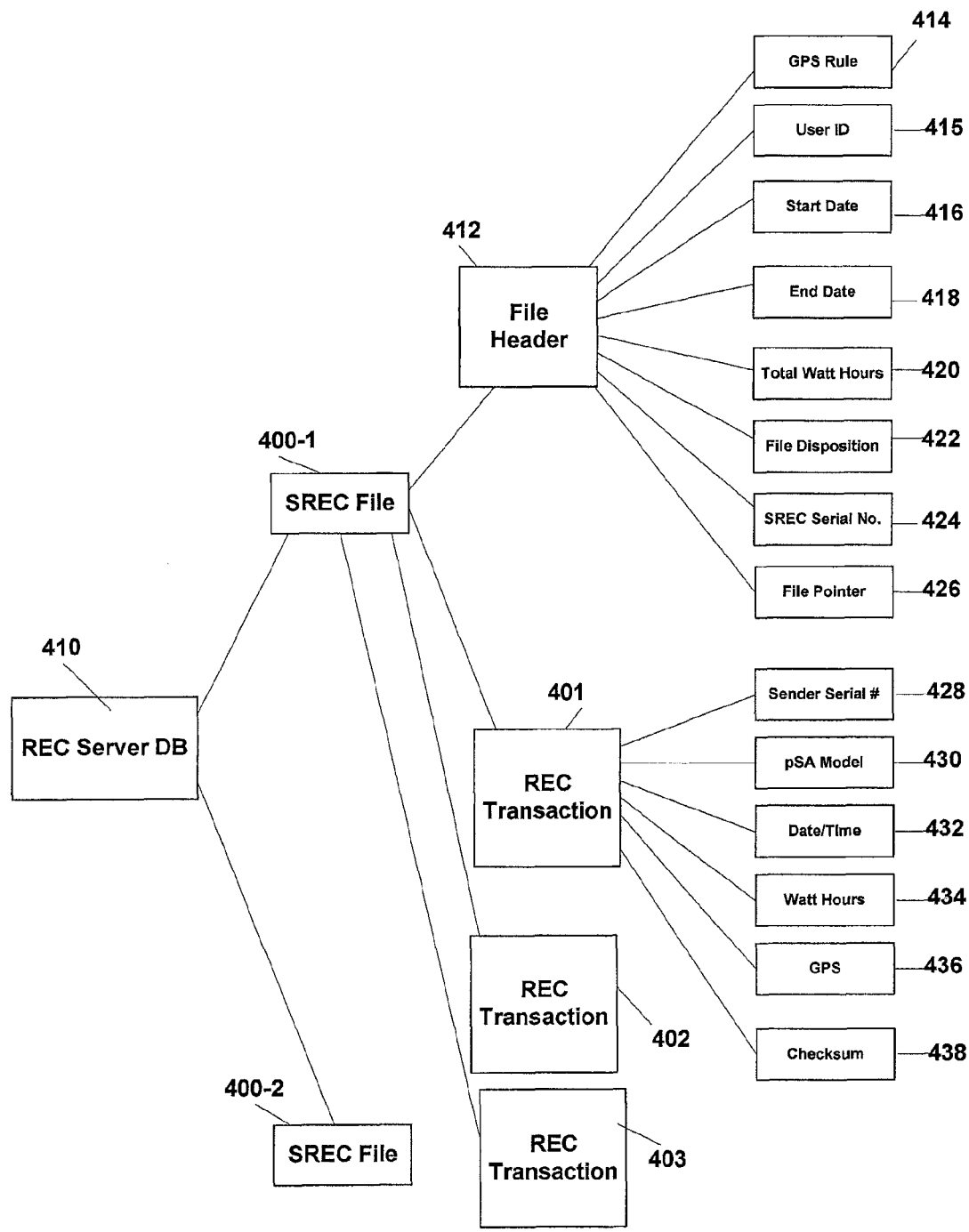
FIG. 4B illustrates an example data structure for a REC file as illustrated in FIG. 4A.

FIG. 4B illustrates a database structure 410 that can be implemented on REC server 107 according to some embodiments of the present invention. As illustrated in FIG. 4B, database structure 410 includes one or more SREC sequential database file structures 400, SREC files 400-1 and 400-2 are shown. As shown in FIG. 4B, file structure 400-1 includes a file header 412 and sequentially stored $REC_t$s 401, 402, and 403. As discussed above, $REC_t$s are added until the file includes accumulated power production to form a complete REC or SREC.

As further shown in FIG. 4B, file header 412 can include one or more fields that hold data in common to all of the $REC_t$s 401, 402, and 403. In the example shown in FIG. 4B, file header 412 includes a GPS rule identifier 414, a user identifier 415, a start date 416, an end date 418, the total amount of power represented 420, a file deposition field 422, a SREC serial number 424, and a file pointer 426. GPS rule 414 identifies the geographic region where the $REC_t$s 401-403 where generated. User ID 415 identifies the owner of SREC file 400-1. The start date 416 is the date when $REC_t$ 401, the first $REC_t$, was entered into file 400-1. The end date 416 is the date when the last $REC_t$, $REC_t$ 403, was entered into file 400-1. The total watt hours 420 represents the aggregated amount of power included in the $REC_t$s 401-403. The file disposition 422 indicates whether SREC file 400-1 is open to new $REC_t$s, closed, accredited, or archived. The SREC serial no. 424 represents the serial number of the SREC generated. File pointer 426 represents the address of the next $REC_t$ to be written into SREC file 400-1.

In the example shown in FIG. 4B, each $REC_t$ also includes several fields. The fields can include a sender serial number 428, a pSA model 430, a date and time stamp 432, power produced 434, GPS location 436, and checksum 438. The sender serial number 428 can be the serial number of smart phone 140 or of pSA 110, depending on which is sender 302. pSA model 430 identifies the model of pSA 110. The date/time stamp 430 represents the date and time that $REC_t$ 401 is sent to REC server 107. The power 434 is the amount of power production reported to REC server 107 in $REC_t$ 401. The GPS 436 represents the geographic location of sender 302. Checksum 438 includes the checksum calculation, the sum of all of the data in the $REC_t$.

Figure 5:
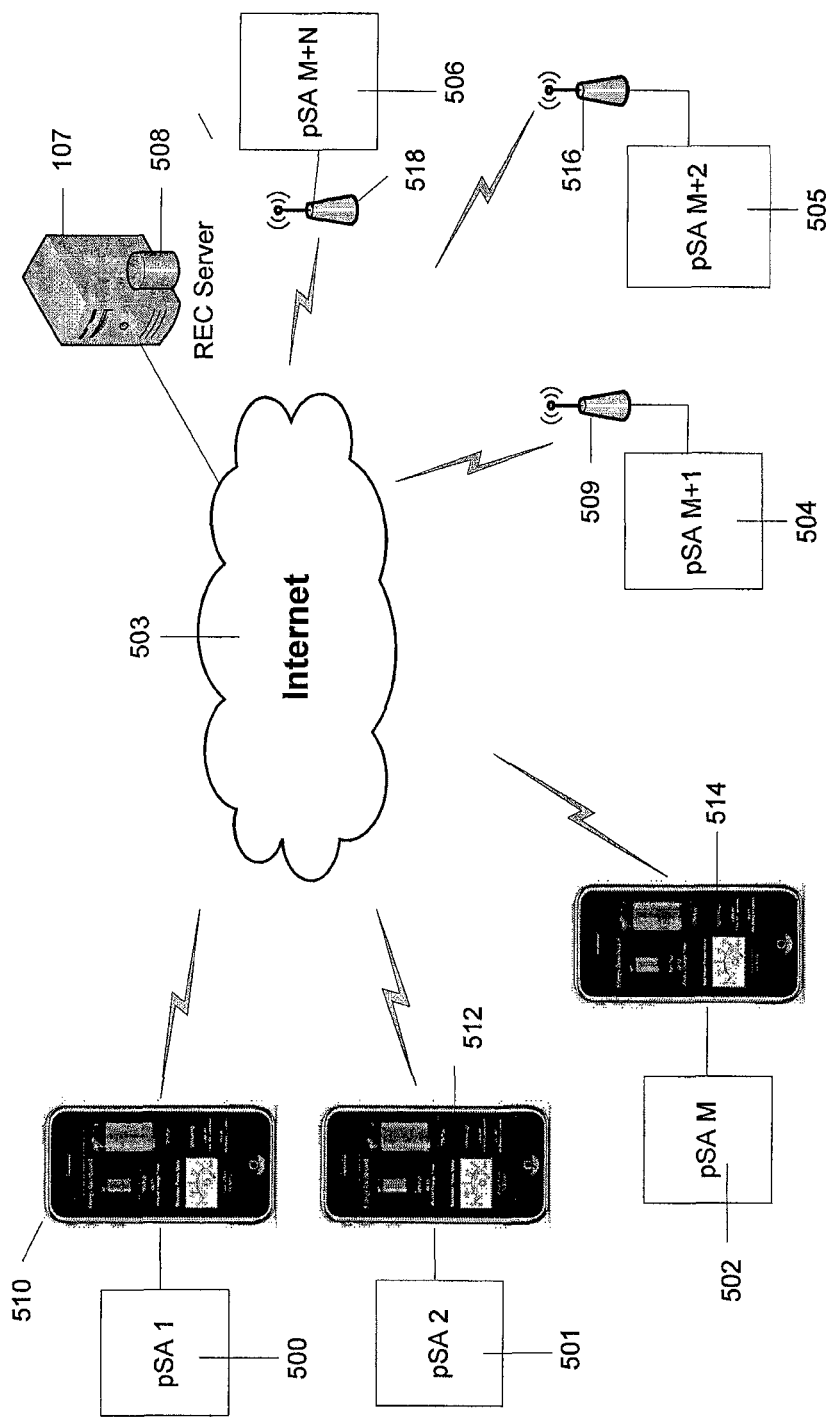
FIG. 5 shows several pSAs communicating through smart phones running an application to communicate through a network to the REC server.

FIG. 5 illustrates a number of different pSAs communicating through an internet connection 503 to REC server 107. The pSA 500 uploads with smart phone 510 through the Internet 503 to REC server 107. REC server 107 stores the $REC_t$ information from pSA 500 in database 508. Further, pSAs 501 through pSA 502 and corresponding smart phones 512 and 514, resulting in M pSA/smart phone pairings, may be located anywhere in the world. Additionally shown are N pSAs with their own network connections, pSAs 504, 505, and 506 with networks 509, 516, and 518, respectively, which also communicate through Internet 503 directly to REC server 507. The pSAs 505 through 506 may also be located anywhere in the world. The M+N renewable energy devices equipped with networking technology create the $REC_t$s that are used to build REC 400. These devices may upload their $REC_t$ at any time depending upon how their users behave and the resulting energy production is aggregated in REC server 508.

Figure 6:
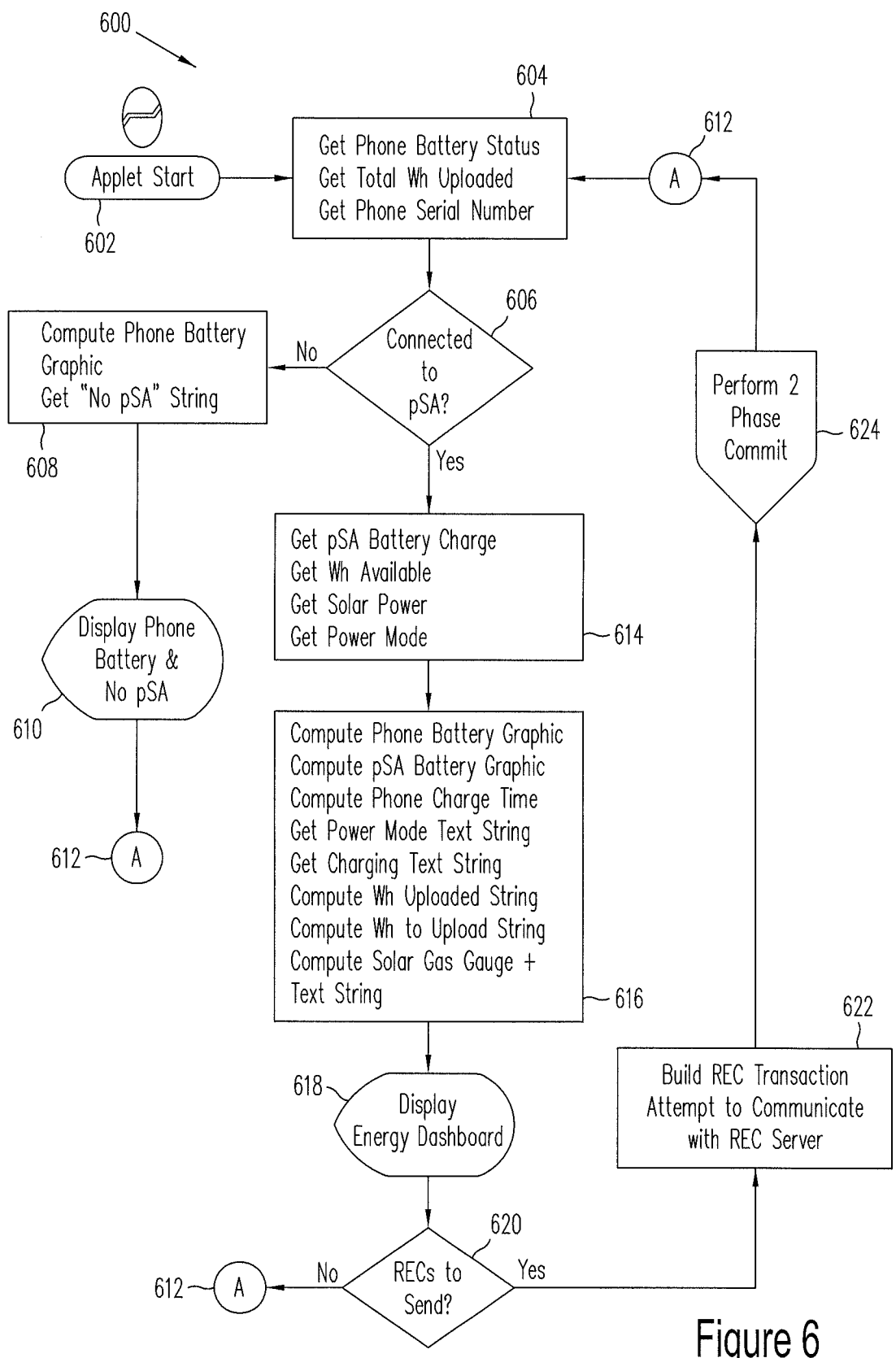
FIG. 6 illustrates an example applet application that can be utilized in a smart phone according to some embodiments of the present invention.

FIG. 6 illustrates an applet thread 600 that can operate on smart phone 104. Applet thread 600 starts in state 602 when a user launches applet 600. From applet start 602, thread 600 transitions to step 604. In step 604, thread 600 obtains the phone battery status and the phone serial number, and upload the total power production from pSA 110. Thread 600 then proceed to step 606. If phone 104 is not connected to pSA 110, then tread 600 proceeds to step 608. In step 608, a phone battery graphic showing the phone battery status and an indicator that no pSA is coupled to the phone is obtained. Thread 600 then proceeds to step 610 where the phone graphic and messaging compiled in step 608 is displayed on the phone. Thread 600 then proceeds to connector 612 and transitions back to step 604.

If, in step 606, it is determined that pSA 110 is connected to smart phone 104, then thread 600 transitions from step 606 to step 614. In step 614, thread 600 communications with pSA 110 to receive the pSA battery charge and the amount of power available, the current production of power by the pSA, and the power mode (which indicates how much power is available). From step 614, thread 600 proceeds to step 616. In step 616, thread 600 computes the phone battery graphic, computes the pSA battery graphic, computes the phone charge time, computes power uploaded and power to upload notices, and computes the current solar production. Once the computations are complete, thread 600 proceeds to step 618 where the information is displayed for the user. A display such as that shown in FIG. 1B, or some other presentation style, may be utilized.

Once the display is finished in step 618, thread 600 transitions to step 620 where it is determined if there is a $REC_t$ to send to REC server 107. The determination may be made to send a $REC_t$ if the amount of power made by pSA 110 since the last $REC_t$ was sent exceeds a threshold amount. If there is no $REC_t$ to send, then tread 600 proceeds to connector 612 and then to step 604. If there is a $REC_t$ to send, then thread 600 proceeds to steps 622 and 624, which may represent the process illustrated in FIG. 3, for example. In step 622, the $REC_t$ record is built and a request is sent to REC server 107. In step 624, once a positive acknowledgment was received from REC server 107, the RECt is transmitted to REC server 107. Any failure in the transmission process, or completion of the transmission process, results in a transition to connector 612. From connector 612, thread 600 transitions back to step 604. Thread 600 can be closed by the user, usually by depressing the same icon that started thread 600.

Although FIG. 6 illustrates operation of a smart phone 104 coupled with a solar appliance 110, the same applet can be utilized to couple with any power appliance that utilizes a renewable energy source.

Figure 7A:
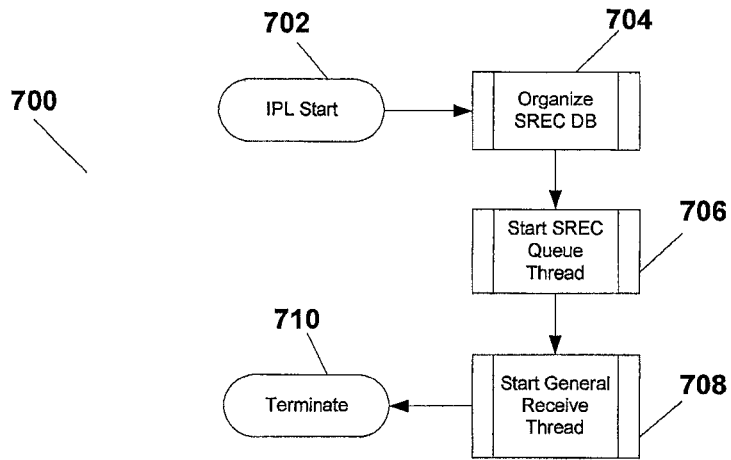
FIGS. 7A through 7D illustrates an example set of threads that may be executed on a REC server according to some embodiments of the present invention.

FIG. 7A illustrates an Initial Program Load (IPL) thread 700 that can be executing on REC server 107. IPL thread 700 starts several threads on REC server 107, including a General Receive thread 708, a Start SREC Queue thread 706, and an Organize SREC DB thread 704. As shown in FIG. 7A, thread 700 starts in step 702 and performs all initial administration tasks, starts general receive thread 708, and other threads. Before starting other threads, IPL thread 700 runs organize thread 704. Organize thread 704 resolves the organization of the SREC database in REC server 107. Thread 704 opens a master SREC file, which contains a list of all SREC files and their disposition (open, closed, archived, etc.). An example file structure is shown in FIG. 4B, for example. An open disposition indicates that the SREC file can receive further $REC_t$s. A closed disposition indicates that the SREC file can not receive further $REC_t$s. An archived disposition indicates that the SREC has already been removed for reimbursement. In some embodiments, SREC files also indicate geographic locations.

Once the open files have been identified and organized by geographic location, for example, thread 700 proceeds to start SREC queue thread 706. The SREC queue environment is created out of the available amount of memory in REC server 107 that may be utilized for the RECt queue and the queue pointers are set up. An example of SREC Queue thread 706 is illustrated in FIG. 7D.

Figure 7B:
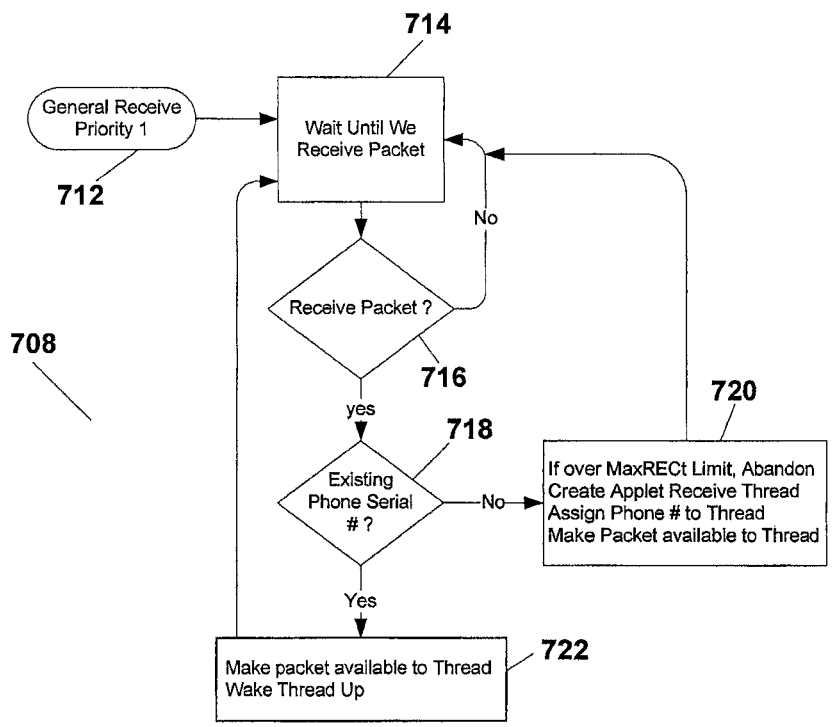
Figure 7C:
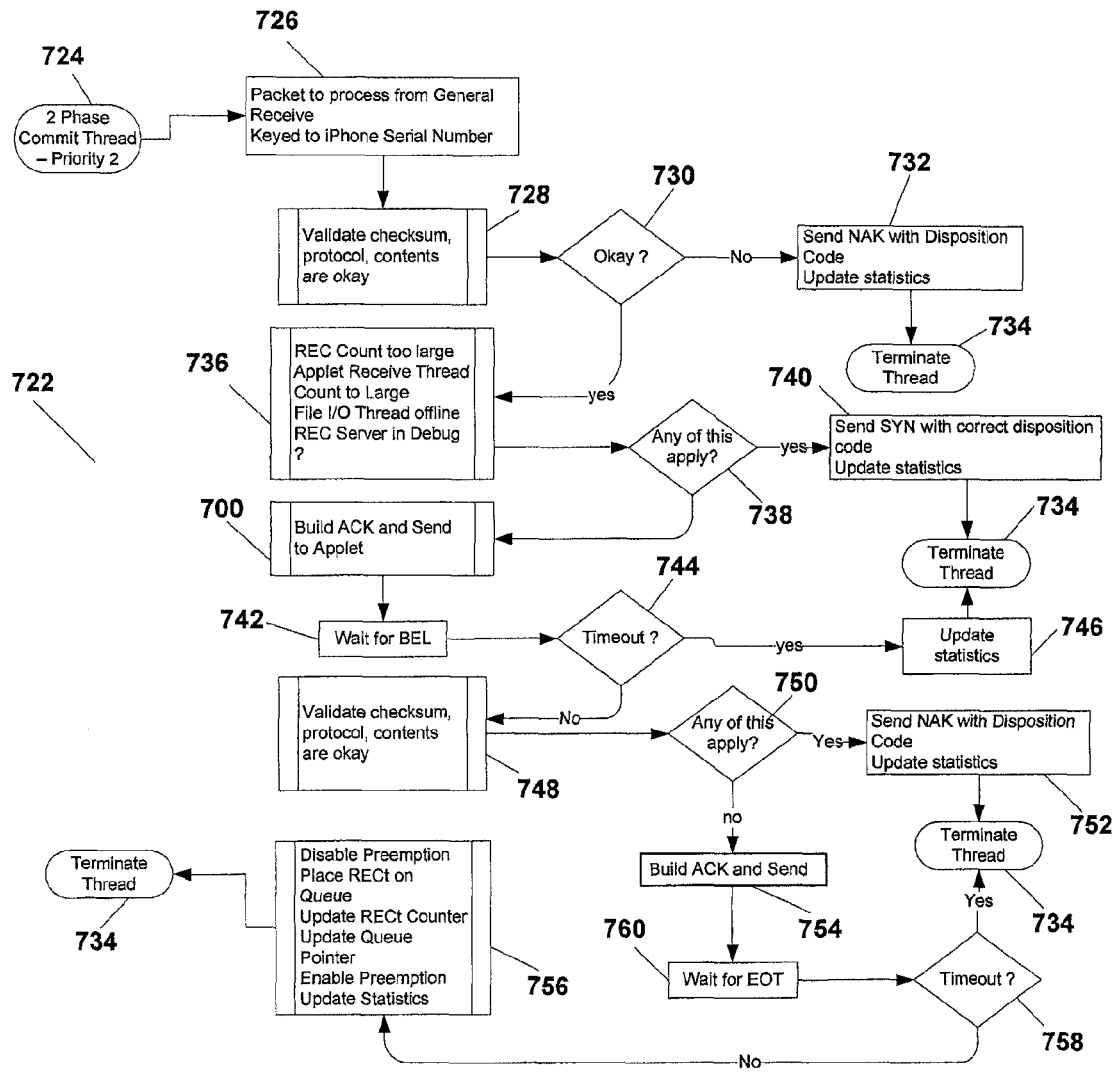
Figure 7D:
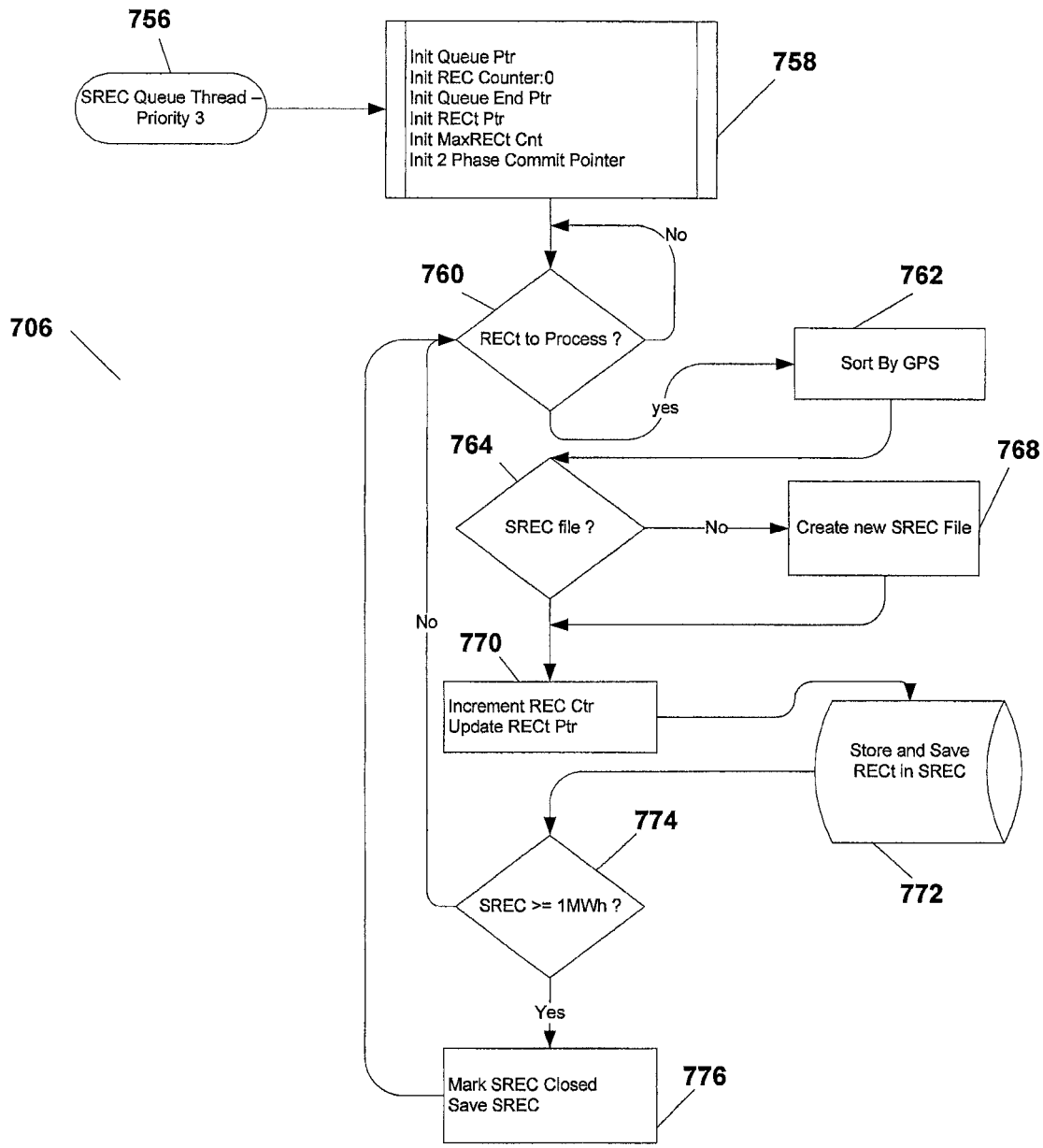

As shown in FIG. 7D, SREC Queue thread 706 starts in step 756 and holds third priority over other threads that IPL 702 starts. In step 758, Queue thread 706 initializes the queue pointers, sets the $REC_t$ counter to 0, initializes the queue end pointer, initializes the $MaxREC_t$ count, and initializes the communications pointer. The Queue pointers include a read and write pointer, which indicates the next available location in the memory Queue to be written and the next location in the queue to be read into an SREC file. The $REC_t$ counter indicates the number of $REC_t$s currently held in the queue. The queue end pointer indicates the last location in the queue. The Max $REC_t$ count indicates the maximum number of $REC_t$s that can be held in the queue. The 2-phase commit pointer indicates the location for a 2-phase commit thread to record its $REC_t$. Once the initializations in step 758 are complete, which is done once upon startup, queue thread 706 proceeds to step 760.

Step 760 will loop back to itself until a $REC_t$ is in the queue for processing. When thread 706 is interrupted by a higher priority thread, thread 700 returns to step 756, but thread 756 recognizes that initialization has already been accomplished and proceeds directly to step 760.

In step 760, if there is an unprocessed $REC_t$ in the queue, thread 706 proceeds to sort 762 where the $REC_t$ is identified as to geographic location and thread 706 proceeds to step 764. In step 764, if an SREC file does not exist for the identified geographic location, thread 706 proceeds to step 768 where an SREC file is created for that location. Once the SREC file is created in step 768, or an appropriate preexisting SREC file is identified in step 764, thread 706 proceeds to step 770. In Step 770, the REC counter is decremented and the $REC_t$ read pointer is updated and thread 706 proceeds to step 772.

In step 772, the $REC_t$ read from the queue is stored in the appropriate SREC file identified in step 764 or created in step 768. From step 772, thread 706 proceeds to step 774. In step 774, the total power production recorded in the SREC file that just received the $REC_t$ is checked to see if enough power is recorded to make an SREC. If not, then thread 706 returns to step 760. If the total power recorded in the SREC file matches or exceeds that needed to form an SREC, then thread 706 proceeds to step 776 where the SREC file disposition is marked closed and the SREC is saved. From step 776, thread 706 returns to step 760.

As further shown in FIG. 7A, thread 700 also starts general receive thread 708. General receive thread 708 is always listening to the network for a packet from an applet. Applets are distinguished one from another based on the serial number of the smart phone transmitting the packet. As discussed further below, packets from an applet can be classified as ENQs, BELs, and EOTs. REC server 107 transmits ACKs, NAKs, or SYNs in response. As discussed further below, an ENQ is an enquiry to determine if REC server 107 is available; a BEL is a renewable energy transaction and includes the $REC_t$; an EOT indicates that the transaction is complete; an ACK is a positive acknowledgement from REC server 107; a NAK is a negative acknowledgment from REC server 107; and a SYN is a request to wait from REC server 107.

As shown in FIG. 7B, general receive thread 708 starts in start 712 and has priority 1. In start 712, thread 708 builds a two phase commit queue. This queue includes several words of data assigned for each two phase commit thread (2PCT). The data includes the serial number, an identity of the two phase commit thread, an IP address for the smart phone, and a wait timer. In some embodiments, the queue entry may include 10 words with the first 6 words utilized to record the smart phone serial number (which may be an 11 digit number), word 7 utilized to indicate the identity of the two phase commit thread, word 8 utilized as a wait timer, and words 9 and 10 utilized to indicate the IP address of smart phone 110. The identity field provides a fast index into the 2PCT data in the queue so that further received data can be matched with the 2PCT record quickly. Other sizes and arrangements can be utilized.

The 2PCT queue has elements including the starting address of the queue, the ending addresses of the queue, the current pointer, the size of each of the 2PCT data, the identity of the queue entry, the maximum number of identities, and a wait timer. The starting and ending addresses designate the physical beginning address and ending address of the queue. The current pointer indicates the current address into which a new 2PCT transaction can be written. The identity assigns an identification to the 2PCT transaction in the queue that is utilized in the identification of incoming data, the maximum identity is the highest number identity that can be assigned and the identity field in the 2PCT queue element indicates the next available identity number. The wait timer provides a wait time (for example, several seconds) before the 2PCT transaction times out and is abandoned.

The 2PCT queue is filled with records as various pSAs communicate $REC_t$s to REC server 107. The 2PCT record is created in the 2PCT queue when an ENQ is sent to REC server 107 and is completed when the BEL packet is sent to REC server. As time passes, the records in the 2PCT queue are either completed by successful interactions with a sender or are timed out and abandoned.

As shown in FIG. 7B, once the queue is established in start 712, thread 708 proceeds to box 714, which cycles with step 716 until a packet is received for consideration. Once a packet is received, thread 708 proceeds from step 716 to step 718. In step 718, the iPhone serial number is checked to see if it is one with a currently active record in the 2PCT queue. If it is, then thread 708 proceeds to activate two-phase commit thread 722 for that record to process the new data. A two-phase commit thread 722 is active for each active record in the 2PCT queue. Once 2PCT thread 722 for that serial number is awakened and provided with the packet, thread 708 returns to step 714.

If the phone serial number does not already have a record open in the 2PCT queue, which indicates the current packet is a BEL packet instead of an ENQ packet, then thread 708 proceeds to step 720. In step 720, the maximum number of records is already open, then thread 708 simply ignores the new 2PCT data and returns to step 714. Alternatively, thread 708 may transmit a wait request. However, if the maximum is not reached, a new 2PCT thread 722 is launched with the new serial number and the incoming packet is provided to the new 2PCT thread 722 for processing. Once launched, thread 708 returns to step 714.

Thread 708 may be interrupted periodically so that the wait timer in each of the active 2PCT records in the 2PCT queue can be decremented. If the wait timer is decremented to zero, the 2PCT record is abandoned and statistics are updated accordingly. Eventually, all of the 2PCT records are extinguished either by being abandoned for timing out or being processed into a SREC file. When the 2PCT current pointer reaches the ending address, the 2PCT queue can be reorganized to move the active 2PCT records to the top of the 2PCT queue and resetting the current pointer to the next available record in the queue.

Figure 9C:
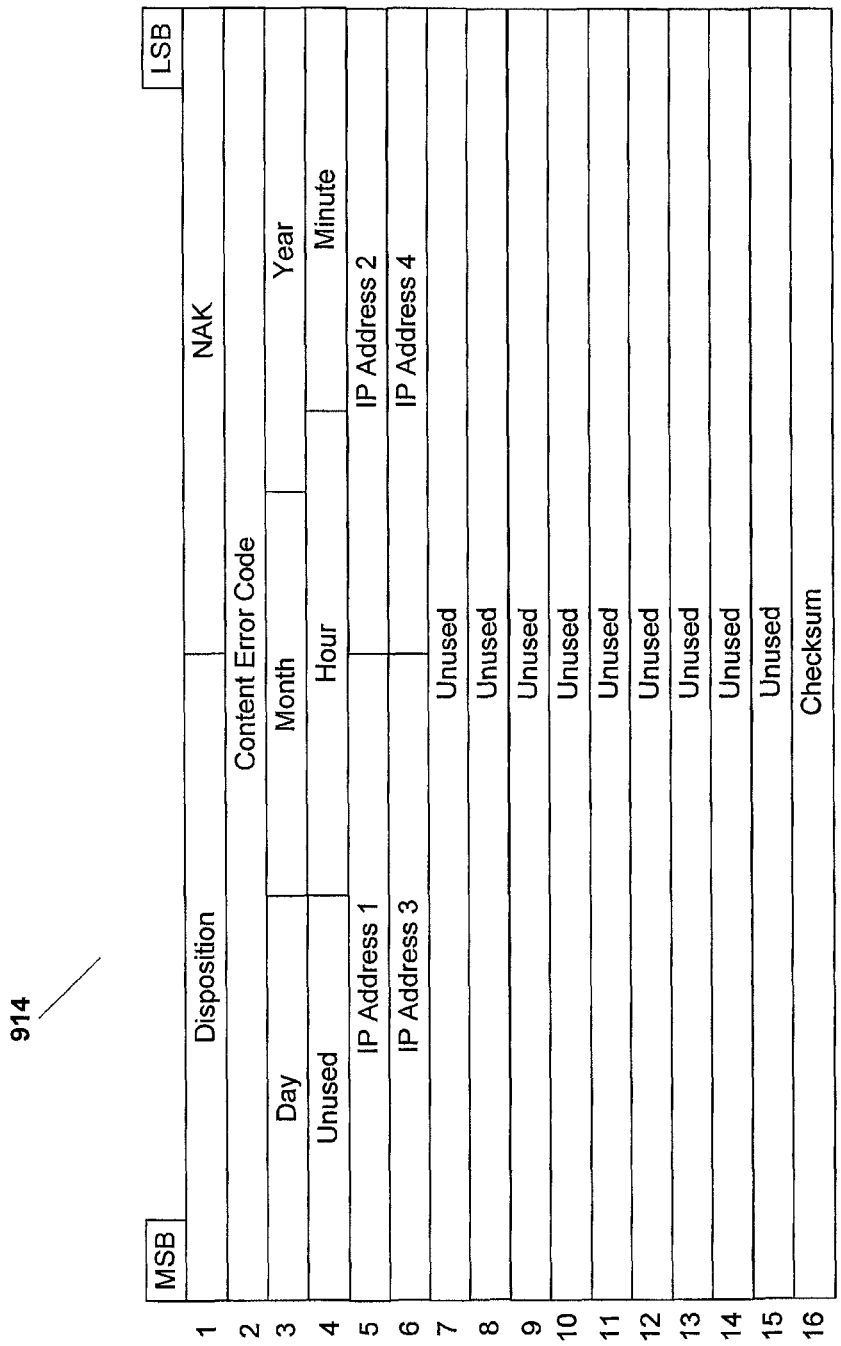
Figure 9D:
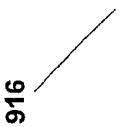
Figure 9F:
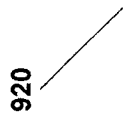

FIG. 7C illustrates an embodiment of 2PCT thread 722. FIGS. 9A through 9E illustrate the packets that may be exchanged between REC server 110 and smart phone 104 according to some embodiments of the invention. As shown in FIGS. 9A through 9E, the packet may include 16 words. In some embodiments, each word may include 16 bits. FIG. 9A illustrates an ENQ packet 910, FIG. 9B illustrates an ACK packet 912, FIG. 9C illustrates a NAK packet 914, FIG. 9D illustrates a SYN packet 916, and FIG. 9E illustrates a BEL packet 918. One skilled in the art will recognize that variations of the packet sizes and arrangements can be made. The particular arrangements and sizes illustrated in FIGS. 9A through 9E are provided as illustrative examples only and are not intended to be limiting of the scope of this disclosure.

FIG. 9A illustrates an example ENQ packet 910 that can be transmitted by smart phone 104 to REC server 107. As shown in FIG. 9A, the enquiry request ENQ is included in word 1, along with an identification of the pSA model. Words 2 and 3 include the date and time of the transmission. Words 4-7 include the GPS information identifying the geographical location of smart phone 104. Words 8-13 include the serial number of smart phone 104. Words 14 and 15 include the unit ID, which can be associated with a particular owner. Word 16 includes a checksum, which is calculated as the sum of all of words 1 through 15 in packet 910.

FIG. 9B illustrates an example ACK packet 912 that can be transmitted by REC server 107. As shown in FIG. 9B, word 1 includes the acknowledgment ACK. The date and time is included in words 3 and 4. The internet protocol (IP) address of smart phone 104 is included in words 5 and 6. Word 16 includes a checksum that is the sum of all of words 1 through 16.

FIG. 9C illustrates an example NAK packet 914 that can be transmitted by REC server 107. REC server 107 transmits a NAK packet if there is a problem with a received packet. As shown in FIG. 9C, word 1 includes a disposition and a NAK code. The disposition code indicates whether there was a checksum error detected or if a content error was detected. Word 2 includes a content error code. Some example content errors include unknown protocol, illegal protocol, illegal date, illegal time, illegal GPS, zero power production uploaded, illegal checksum from REC, illegal checksum from Applet. Other content indications can also be included. The IP address of smart phone 104 is included in words 7 and 8 and a checksum is included in word 16.

FIG. 9D illustrates an example wait or SYN packet 916 that can be transmitted by REC server 107. REC server 107 transmits a SYN packet 916 if there is a need to wait for further upload. As shown in FIG. 9D, word 1 indicates a wait time request and the SYN code. The wait time request indicates how long a waiting period should be provided before trying to send another $REC_t$. Word 2 includes the disposition code. Example codes could indicate REC server application congestion, REC server network congestion, debugging efforts, or an indication that the data base is off-line. As before, words 3 and 4 include the date and time and words 5 and 6 include the IP address of smart phone 104. Word 16 includes the checksum.

FIG. 9E illustrates an example of a BEL, or $REC_t$, transmission packet 918 that can be transmitted by smart phone 104. As shown in FIG. 9E, word 1 includes the model number of the originating pSA along with a BEL action code. Words 2 and 3 include the date and time. Words 4-7 include the geographic location data. Words 8-13 include the serial number of smart phone 104. Word 15 indicates the amount of power produced by pSA 110. Word 16 includes the checksum for the packet.

FIG. 9E illustrates an example EOT packet 920 that can be transmitted by smart phone 104. EOT packet 920 signifies the end of a successful transaction and confirms the deletion of the $REC_t$ information from the pSA and smart phone 104. As shown in FIG. 9E, EOT packet 920 is the same as ENQ packet 210 with an EOT code substituted for the ENQ code.

Using the example packets illustrated in FIGS. 9A through 9E, 2PCT thread 722 can be discussed. As discussed above, 2PCT thread 722 is started for each record in 2PCT queue by receive thread 708 when a packet is received. 2PCT thread 722 is started in step 720 of thread 708 when a packet from a new smart phone 104 is received and restarted when a second packet from the same smart phone 104 is received.

As shown in FIG. 7C, 2PCT thread 722 starts in step 724 and proceeds to step 726 to receive the received packet from general thread 708. Each 2PCT thread 722 is indexed to the smart phone serial number indicated in the ENQ packet 910 received into step 726. Once ENQ packet 910, such as that shown in FIG. 9A, is received, thread 722 proceeds to step 728 where the checksum and the contents are checked. In step 730, if the there is a problem with the perceived packet, then thread 722 proceeds to step 732 where a NAK packet 914 such as that shown in FIG. 9C is transmitted and the statistics used to monitor packet transmission are updated. From step 732, thread 722 terminates in step 734.

If the contents and checksum are correct, then step 730 proceeds to step 736. In step 736, the conditions that lead to a wait request (e.g., the current 2PCT queue is filled to capacity or there is a problem with proceeding) are evaluated. In step 738, if a wait request is warranted, thread 722 proceeds to step 740 where a SYN packet 916 as illustrated in FIG. 9D is transmitted. The appropriate statistics are then updated and thread 722 terminates in step 734.

If the conditions for a wait do not apply, then thread 722 proceeds from step 738 to step 700 where an ACK packet 912 is transmitted. An ACK packet 912 is illustrated in FIG. 9B. Further, information received with the ENQ packet 910 is added to the record in the 2PCT queue. Thread 722 then proceeds to wait in step 742. At this point, thread 722 becomes inactive.

In step 742, thread 722 is awakened either when a new packet is received from a smart phone with the same serial number or thread 722 has timed out. Once awakened, thread 722 proceeds to step 744. If thread 722 has timed out, then thread 722 proceeds to step 746 to update statistics and then terminates in step 734. If there is no time out, the thread 722 proceeds to step 748. In step 748, the contents of the received packet, which is a BEL packet 918 that includes the data for a $REC_t$, are check for the correct checksum, protocols, and contents. Thread 748 then proceeds to step 750.

In step 750, if there is a problem with the packet, thread 722 proceeds to step 752. In step 752, a NAK packet 914 is transmitted. In some embodiments, if the conditions warrant a wait, a wait condition may be tested and a SYN packet 916 transmitted. If everything is OK, then thread 722 moves from step 750 to step 754. In step 754, an ACK packet 912 is sent and thread 722 proceeds to step 760.

In step 760, thread 722 waits for an EOT packet such as that shown in FIG. 7F. If the EOT packet is received or the process has timed out, then thread 722 proceeds to step 758. If a timeout condition exists, then thread 722 terminates in step 734. Otherwise, thread 722 proceeds to step 756. In step 756, thread 722 places the received data in the appropriate record in the 2PCT queue. Thread 722 then terminates in thread 734.

Figure 10:
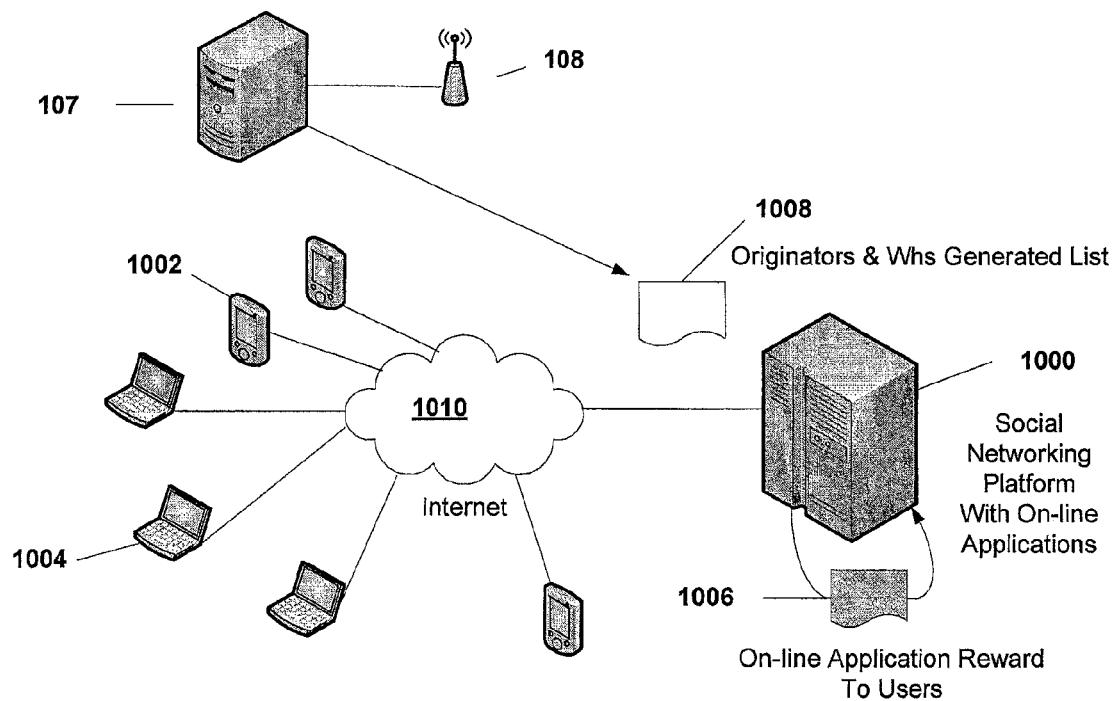
FIG. 10 illustrates interaction of the REC server with a social networking platform according to some embodiments of the present invention.

FIG. 10 illustrates an example where REC server 107 transmits a REC server list 1008, which includes list of owners and the power generation that they have accumulated credit, to a social networking platform 1000 that runs a set of on-line applications. Social networking platform 1000 can make REC server list 1008 available to on-line applications, that in turn converts the information included in REC server list 1008 to various rewards. As shown in FIG. 10, REC server 107 communicates REC server list 1008 to social networking platform 1000, which provides information to on-line applications operating on platform 1000 regarding owner/originators and the power that their devices have generated. REC server list 1008 can be modified by social networking platform 1000 according to on-line applications to produce a rewards list 1006. Rewards list 1006 may be based on virtually any criteria that on-line users 1002 or 1004, which are coupled to social network platform 1000 through network 1010, find interesting or useful. REC server 107 can send REC server list 1008 in real time, every 10 minutes, or once a day depending upon business rules. The location of the originator may even be a factor.

The pSA's can be fully distributed solar renewable energy devices that may move around as circumstances dictate and may recharge or power many devices. By pairing the pSAs with mobile communications capabilities, either directly or indirectly, the production of renewable energy may be captured and packaged into renewable energy certificates for subsequent sale or trade. Similarly, other small energy producers, whether or not mobile, may be aggregated to form RECs. The activities of capturing renewable energy transactions in the real world may also be utilized in the virtual world to generate various rewards. This may happen through the creation of a social contract between the product company and its customers. The product company may, for example, agree to utilize the renewable energy transactions in various ways that reward the customers and the customers agree to make the renewable energy transactions. Through these mechanisms, distributed small renewable energy devices may become a factor in the worldwide efforts to mitigate global warming The embodiments described above are meant as examples of the invention only and are not intended to be limiting. One skilled in the art may recognize various modifications that, although not explicitly described, are intended to be within the scope of this invention. As such, the invention is limited only by the following claims.

What is claimed is:

1. An apparatus, comprising:
a power source;
an electronic circuit coupled to the power source, the electronic circuit being configured to charge a battery and provide power to a connector when an external device is coupled to the connector;
a processor coupled to the electronic circuit;
a wireless interface coupled to the processor; and
a wireless antenna coupled to the wireless interface;
wherein the processor is configured to:
control the charging of the battery;
control distribution of power to the external device;
compile a transmission record of an amount of power produced by the apparatus; and
communicate with a renewal energy certificate (REC) server using the wireless interface.

2. The apparatus of claim 1, wherein the power source is a solar cell.

3. The apparatus of claim 1, wherein the processor is further configured to update and transmit the transmission record to the connector when the external device is coupled to the connector.

4. The apparatus of claim 3, wherein the processor is further configured to reset the transmission record when a signal is received from the connector.

5. The apparatus of claim 1, further including an interface to a network wherein the processor is further configured to transmit the transmission record to the REC server through the interface.

6. The apparatus of claim 5, wherein the processor is further configured to:
receive a confirmation receipt from the REC server; and
clear the transmission record when the confirmation receipt is received.

7. The apparatus of claim 1, wherein communication with the REC server is accomplished in a two-phase commit protocol interaction.

8. The apparatus of claim 1, further including a global satellite system coupled to the processor that provides geographical location data.

9. The apparatus of claim 1, wherein the external device is a smart phone.

10. The apparatus of claim 9, wherein the processor is further configured to transmit the transmission record to a dashboard application on the smart phone.

11. The apparatus of claim 1, wherein the processor is further configured to transmit the transmission record to the REC server.

12. The apparatus of claim 1, wherein the processor is further configured to transmit a REC transaction to the REC server.

13. The apparatus of claim 1, wherein the connector is a USB connector.

* * * * *